US008000065B2

United States Patent
Yamazaki

(10) Patent No.: US 8,000,065 B2
(45) Date of Patent: Aug. 16, 2011

(54) MAGNETORESISTIVE ELEMENT AND THIN-FILM MAGNETIC HEAD

(75) Inventor: Hiroshi Yamazaki, Tokyo (JP)

(73) Assignee: TDK Corporation, Tokyo (JP)

( * ) Notice: Subject to any disclaimer, the term of this patent is extended or adjusted under 35 U.S.C. 154(b) by 437 days.

(21) Appl. No.: 12/320,520

(22) Filed: Jan. 28, 2009

(65) Prior Publication Data

US 2010/0188782 A1    Jul. 29, 2010

(51) Int. Cl.
  *G11B 5/33* (2006.01)
  *G11B 5/127* (2006.01)
(52) U.S. Cl. ........... 360/324.12; 360/324.1; 360/324.11; 360/324.2
(58) Field of Classification Search ............... 360/324.12
  See application file for complete search history.

(56) References Cited

U.S. PATENT DOCUMENTS

| | | | |
|---|---|---|---|
| 6,185,077 B1 * | 2/2001 | Tong et al. | 360/324.11 |
| 6,381,107 B1 * | 4/2002 | Redon et al. | 360/324.2 |
| 6,636,395 B1 * | 10/2003 | Terunuma | 360/324.11 |
| 6,756,135 B2 * | 6/2004 | Hasegawa et al. | 428/811.5 |
| 7,782,575 B2 * | 8/2010 | Tsuchiya et al. | 360/324.1 |
| 7,808,750 B2 * | 10/2010 | Yanagisawa et al. | 360/324.12 |
| 7,843,668 B2 * | 11/2010 | Machita et al. | 360/319 |
| 7,863,700 B2 * | 1/2011 | Kreupl et al. | 257/421 |
| 7,902,616 B2 * | 3/2011 | Klostermann et al. | 257/421 |
| 2004/0061986 A1 * | 4/2004 | Kagami et al. | 360/324.11 |
| 2004/0126304 A1 | 7/2004 | Zhao | |
| 2004/0183110 A1 | 9/2004 | Honlein et al. | |
| 2007/0206333 A1 * | 9/2007 | Watanabe et al. | 360/313 |

FOREIGN PATENT DOCUMENTS

| | | |
|---|---|---|
| EP | 1 052 520 B1 | 7/2005 |
| JP | A-2000-323767 | 11/2000 |
| JP | A-2004-221442 | 8/2004 |
| JP | A-2004-535074 | 11/2004 |
| JP | A-2007-531278 | 11/2007 |
| JP | A-2007-3335532 | 12/2007 |
| WO | WO 02/063693 A1 | 8/2002 |
| WO | WO 2006/022859 A2 | 3/2006 |

* cited by examiner

*Primary Examiner* — Son Mai
(74) *Attorney, Agent, or Firm* — Oliff & Berridge, PLC

(57) ABSTRACT

A magnetoresistive element includes: a detection surface that receives a magnetic field to be detected; a free layer made of a ferromagnetic material, having an end face located in the detection surface, and exhibiting a change in magnetization direction in response to the magnetic field to be detected; a pinned layer made of a ferromagnetic material, disposed away from the detection surface, and having a fixed magnetization direction; and a coupling portion made of a nonmagnetic material and coupling the free layer to the pinned layer. The coupling portion includes a nonmagnetic conductive layer that allows electrons to be conducted while conserving their spins.

14 Claims, 18 Drawing Sheets

MAGNETORESISTIVE ELEMENT AND THIN-FILM MAGNETIC HEAD

BACKGROUND OF THE INVENTION

1. Field of the Invention

The present invention relates to a magnetoresistive element, and to a thin-film magnetic head, a head assembly and a magnetic disk drive each of which includes the magnetoresistive element.

2. Description of the Related Art

Performance improvements in thin-film magnetic heads have been sought as a real recording density of magnetic disk drives has increased. A widely used type of thin-film magnetic head is a composite thin-film magnetic head that has a structure in which a read head and a write head are stacked on a substrate. The read head has a magnetoresistive element (hereinafter, also referred to as an MR element) for reading, and the write head has an induction-type electromagnetic transducer for writing.

Examples of the MR element include a giant magnetoresistive (GMR) element utilizing a giant magnetoresistive effect, and a tunneling magnetoresistive (TMR) element utilizing a tunneling magnetoresistive effect. Read heads are required to have characteristics of high sensitivity and high output. As the read heads that satisfy such requirements, those incorporating spin-valve GMR elements or TMR elements have been mass-produced.

A spin-valve GMR element and a TMR element each typically include a free layer, a pinned layer, a spacer layer disposed between the free layer and the pinned layer, and an antiferromagnetic layer disposed on a side of the pinned layer farther from the spacer layer. The free layer is a ferromagnetic layer whose magnetization direction changes in response to a signal magnetic field. The pinned layer is a ferromagnetic layer whose magnetization direction is fixed. The antiferromagnetic layer is a layer that fixes the magnetization direction of the pinned layer by means of exchange coupling with the pinned layer. The spacer layer is a nonmagnetic conductive layer in a spin-valve GMR element, and is a tunnel barrier layer in a TMR element.

Examples of the GMR element include one having a current-in-plane (CIP) structure in which a current for use for detecting a signal magnetic field (hereinafter referred to as a sense current) is fed in the direction parallel to the planes of the layers constituting the GMR element, and one having a current-perpendicular-to-plane (CPP) structure in which the sense current is fed in a direction intersecting the planes of the layers constituting the GMR element, such as the direction perpendicular to the planes of the layers constituting the GMR element. The TMR element mentioned above also has the CPP structure.

A read head includes a pair of shields sandwiching the MR element. The distance between the two shields taken in a detection surface that receives a magnetic field to detect (i.e., a medium facing surface) is called a read gap length. Recently, with an increase in recording density, there have been increasing demands for a reduction in track width and a reduction in read gap length in read heads.

In a typical configuration of an MR element having the free layer, the pinned layer, the spacer layer and the antiferromagnetic layer, an end face of each of the free layer, the pinned layer, the spacer layer and the antiferromagnetic layer is exposed at the detection surface. In the MR element having such a configuration, it is difficult to reduce the read gap length because the antiferromagnetic layer is relatively great in thickness.

Attention has been recently given to carbon materials having a graphene structure, such as a graphene thin film and a carbon nanotube, because of their capability of conducting electrons over a long distance while conserving their spins. Here, the graphene structure refers to a structure in which a plurality of carbon atoms are bonded to one another in the form of a hexagonal mesh. The graphene thin film is a thin film consisting of a single atomic layer having a graphene structure or a plurality of atomic layers stacked each having a graphene structure. In particular, a thin film consisting only of a single atomic layer having a graphene structure is called graphene. The carbon nanotube is a tube composed of a film consisting of a single atomic layer having a graphene structure or a plurality of atomic layers each having a graphene structure.

A variety of MR elements using carbon materials having a graphene structure have been proposed. For example, U.S. Patent Application Publication No. 2004/0183110 A1, WO 2006/022859 A2, and JP-A 2004-221442 each disclose an MR element having two ferromagnetic layers that are opposed in the vertical direction and a carbon nanotube interposed between them.

WO 02/063693 A1 discloses an MR element in which two electrodes made of a magnetic metal are respectively provided on both ends of a multilayer carbon nanotube lying in the horizontal direction. European Patent No. 1052520 B1 discloses an MR element in which a channel region provided between first and second ferromagnetic regions is formed of a carbon nanotube, for example. JP-A 2007-335532 discloses an MR element in which two ferromagnetic electrodes are disposed on graphene formed on a silicon surface of a silicon carbide substrate.

U.S. Patent Application Publication No. 2004/0126304 A1 discloses a superconducting carbon nanotube that provides a great MR effect.

For the MR elements disclosed in U.S. Patent Application Publication No. 2004/0183110 A1, WO 2006/022859 A2 and JP-A 2004-221442, it is impossible to reduce the read gap length because these MR elements have such a structure that the spacer layer of a typical CPP-structure GMR element is replaced with a carbon nanotube.

The MR elements disclosed in WO 02/063693 A1, European Patent No. 1052520 B1 and JP-A 2007-335532 each have a structure in which two ferromagnetic layers serving as two electrodes are respectively provided on the horizontally-opposite sides of a carbon nanotube or graphene lying in the horizontal direction, and include no antiferromagnetic layer. These MR elements therefore allow a reduction in read gap length. However, it is difficult with these MR elements to achieve highly-accurate magnetic field detection because of the following reason. In these MR elements, the two ferromagnetic layers exhibit a change in magnetization direction in response to a signal magnetic field. WO 02/063693 A1 and European Patent No. 1052520 B1 teach configuring the two ferromagnetic layers to flip their magnetization directions at different magnetic field magnitudes so that the resistance of the MR element varies according to the magnitude of the signal magnetic field. However, for the MR elements that detect a signal magnetic field by such a method, the detectable magnitude range of the signal magnetic field is limited and the sensitivity to the signal magnetic field is reduced.

OBJECT AND SUMMARY OF THE INVENTION

It is an object of the present invention to provide a magnetoresistive element that allows a reduction in distance between a pair of shields sandwiching the magnetoresistive element taken in a detection surface, and to provide a thin-film magnetic head, a head assembly and a magnetic disk drive each of which includes the magnetoresistive element.

A magnetoresistive element of the present invention includes: a detection surface that receives a magnetic field to be detected; a free layer made of a ferromagnetic material and having an end face located in the detection surface, the free layer exhibiting a change in magnetization direction in response to the magnetic field to be detected; a pinned layer made of a ferromagnetic material and disposed away from the detection surface, the pinned layer having a fixed magnetization direction; and a coupling portion made of a nonmagnetic material and coupling the free layer and the pinned layer to each other. The coupling portion includes a nonmagnetic conductive layer that allows electrons to be conducted while conserving their spins.

In the magnetoresistive element of the present invention, each of the free layer and the pinned layer may have a surface touching the coupling portion, and the distance between the detection surface and an end of the surface of the pinned layer touching the coupling portion closest to the detection surface may be greater than the distance between the detection surface and an end of the surface of the free layer touching the coupling portion farthest from the detection surface.

The magnetoresistive element of the present invention may further include an antiferromagnetic layer for fixing the magnetization direction of the pinned layer, the antiferromagnetic layer being disposed away from the detection surface.

In the magnetoresistive element of the present invention, the nonmagnetic conductive layer may be formed of a carbon material having a graphene structure.

In the magnetoresistive element of the present invention, the nonmagnetic conductive layer may be formed of a graphene thin film.

In the magnetoresistive element of the present invention, the coupling portion may further include a tunnel barrier layer disposed between the nonmagnetic conductive layer and one of the free layer and the pinned layer.

A thin-film magnetic head of the present invention includes: a medium facing surface that faces toward a recording medium; a first shield and a second shield each extending in a direction intersecting the medium facing surface; and a magnetoresistive element disposed between the first and second shields near the medium facing surface to detect a signal magnetic field sent from the recording medium. The magnetoresistive element includes: a detection surface that is located in the medium facing surface and receives the signal magnetic field sent from the recording medium; a free layer made of a ferromagnetic material and having an end face located in the detection surface, the free layer exhibiting a change in magnetization direction in response to the signal magnetic field; a pinned layer made of a ferromagnetic material and disposed away from the detection surface, the pinned layer having a fixed magnetization direction; and a coupling portion made of a nonmagnetic material and coupling the free layer and the pinned layer to each other. The coupling portion includes a nonmagnetic conductive layer that allows electrons to be conducted while conserving their spins.

In the thin-film magnetic head of the present invention, each of the free layer and the pinned layer may have a surface touching the coupling portion, and the distance between the detection surface and an end of the surface of the pinned layer touching the coupling portion closest to the detection surface may be greater than the distance between the detection surface and an end of the surface of the free layer touching the coupling portion farthest from the detection surface.

The thin-film magnetic head of the present invention may further include an antiferromagnetic layer for fixing the magnetization direction of the pinned layer, the antiferromagnetic layer being disposed away from the detection surface.

In the thin-film magnetic head of the present invention, the nonmagnetic conductive layer may be formed of a carbon material having a graphene structure.

In the thin-film magnetic head of the present invention, the nonmagnetic conductive layer may be formed of a graphene thin film.

In the thin-film magnetic head of the present invention, the coupling portion may further include a tunnel barrier layer disposed between the nonmagnetic conductive layer and one of the free layer and the pinned layer.

A head assembly of the present invention includes: a slider disposed to face toward a recording medium; and a supporter flexibly supporting the slider, the slider including the thin-film magnetic head of the invention.

A magnetic disk drive of the present invention includes: a slider disposed to face toward a recording medium that is driven to rotate; and an alignment device supporting the slider and aligning the slider with respect to the recording medium, the slider including the thin-film magnetic head of the invention.

According to the magnetoresistive element, the thin-film magnetic head, the head assembly and the magnetic disk drive of the present invention, the free layer and the pinned layer are coupled to each other by the coupling portion including the nonmagnetic conductive layer that allows electrons to be conducted while conserving their spins. It is therefore possible to produce a magnetoresistive effect by the free layer, the coupling portion and the pinned layer. Furthermore, in the present invention, the pinned layer is disposed away from the detection surface that receives a magnetic field to be detected. Consequently, according to the present invention, it is possible to reduce the distance between a pair of shields sandwiching the magnetoresistive element taken in the detection surface.

Other and further objects, features and advantages of the invention will appear more fully from the following description.

DETAILED DESCRIPTION OF THE PREFERRED EMBODIMENTS

First Embodiment

Figure 5:
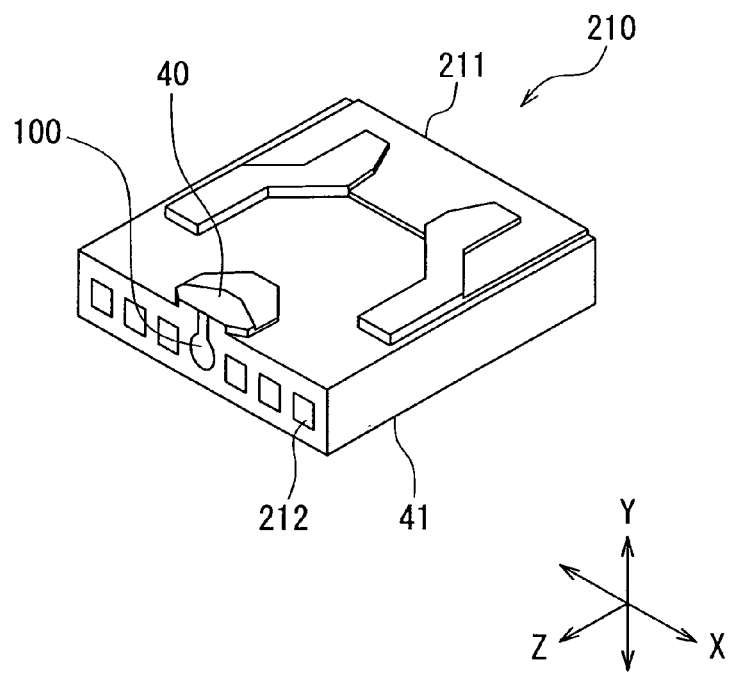
FIG. 5 is a perspective view of a slider including the thin-film magnetic head according to the first embodiment of the present invention.

Embodiments of the present invention will now be described in detail with reference to the drawings. Reference is first made to FIG. 5 to describe a slider 210 including a thin-film magnetic head according to a first embodiment of the present invention. In a magnetic disk drive the slider 210 is placed to face toward a circular-plate-shaped recording medium (a magnetic disk) that is driven to rotate. In FIG. 5 the X direction is across the tracks of the recording medium, the Y direction is perpendicular to the surface of the recording medium, and the Z direction is the direction of travel of the recording medium as seen from the slider 210. The X, Y and Z directions are orthogonal to one another. The slider 210 has a base body 211. The base body 211 is nearly hexahedron-shaped. One of the six surfaces of the base body 211 is designed to face toward the surface of the recording medium. At this one of the six surfaces, there is formed a medium facing surface 40 to face toward the recording medium. When the recording medium rotates and travels in the Z direction, an airflow passing between the recording medium and the slider 210 causes a lift below the slider 210 in the Y direction of FIG. 5. This lift causes the slider 210 to fly over the surface of the recording medium. The thin-film magnetic head 100 according to the present embodiment is formed near the air-outflow-side end (the end located at the lower left of FIG. 5) of the slider 210. Six terminals 212 are also provided at the air-outflow-side end of the slider 210.

A head assembly according to the present embodiment will now be described with reference to FIG. 6. The head assembly according to the present embodiment includes the slider 210 shown in FIG. 5 and a supporter that flexibly supports the slider 210. Forms of this head assembly include a head gimbal assembly and a head arm assembly described below.

The head gimbal assembly 220 will be first described. The head gimbal assembly 220 has the slider 210 and a suspension 221 as the supporter that flexibly supports the slider 210. The suspension 221 has: a plate-spring-shaped load beam 222 formed of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the X direction across the tracks of a magnetic disk 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 6:
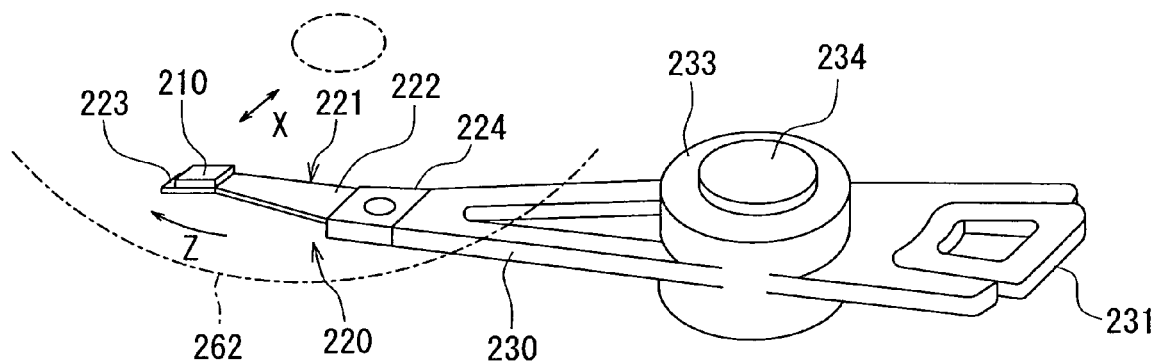
FIG. 6 is a perspective view of a head arm assembly according to the first embodiment of the present invention.

FIG. 6 shows the head arm assembly according to the present embodiment. In this head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 7:
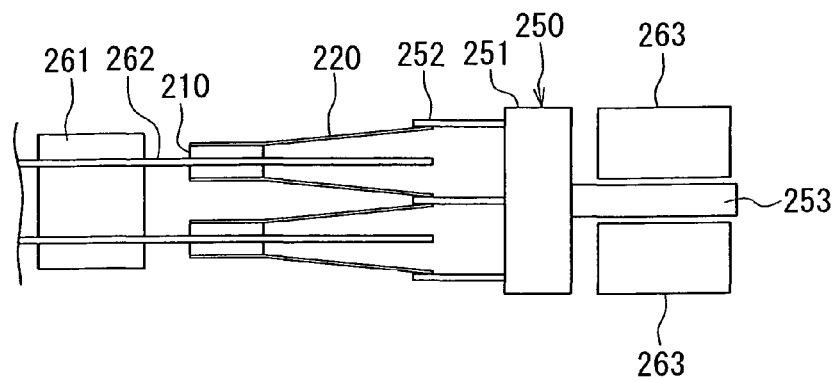
FIG. 7 is an illustrative view for illustrating a main part of a magnetic disk drive according to the first embodiment of the present invention.
Figure 8:
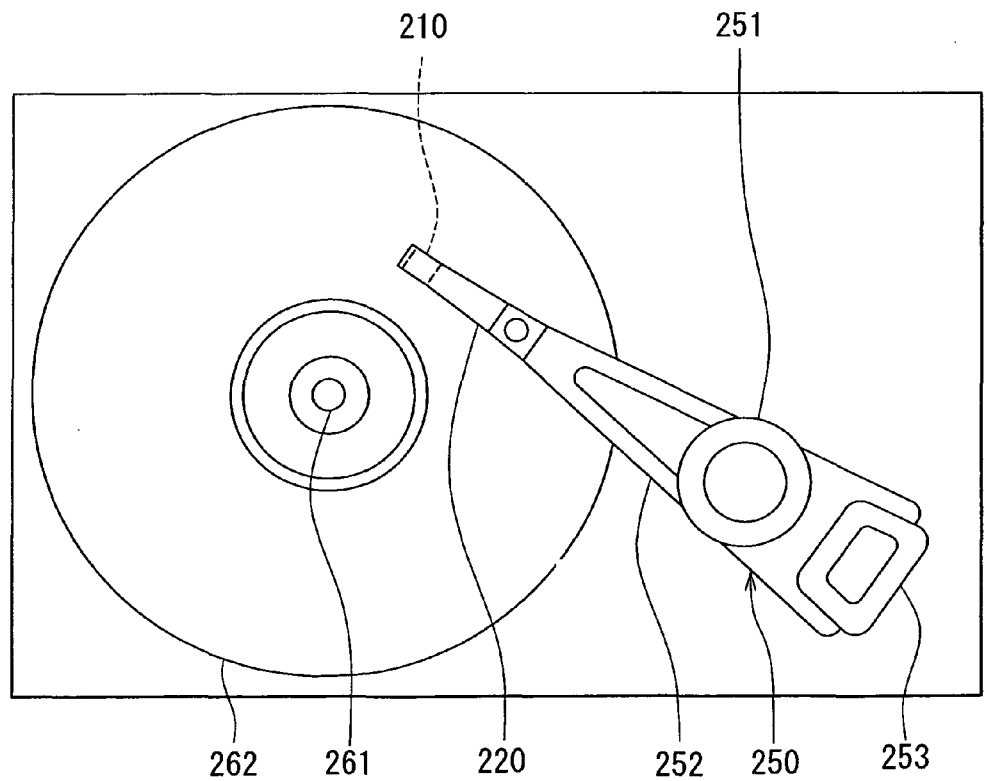
FIG. 8 is a plan view of the magnetic disk drive according to the first embodiment of the present invention.

Reference is now made to FIG. 7 and FIG. 8 to describe an example of the head stack assembly and the magnetic disk drive according to the present embodiment. FIG. 7 is an illustrative view showing a main part of the magnetic disk drive. FIG. 8 is a plan view of the magnetic disk drive. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 that is part of the voice coil motor is mounted on a side of the carriage 251 opposite to the arms 252. The head stack assembly 250 is installed in the magnetic disk drive. The magnetic disk drive includes a plurality of magnetic disks 262 mounted on a spindle motor 261. Two sliders 210 are allocated to each magnetic disk 262 such that the two sliders 210 are opposed to each other with the disk 262 disposed in between. The voice coil motor includes permanent magnets 263 disposed to be opposed to each other, the coil 253 of the head stack assembly 250 being placed between the magnets 263. The actuator and the head stack assembly 250 except the sliders 210 support the sliders 210 and align them with respect to the magnetic disks 262.

In the magnetic disk drive according to the present embodiment, the actuator moves the slider 210 across the tracks of the magnetic disk 262 and aligns the slider 210 with respect to the magnetic disk 262. The thin-film magnetic head included in the slider 210 writes data on the magnetic disk 262 by using a write head, and reads data stored on the magnetic disk 262 by using a read head.

Figure 3:
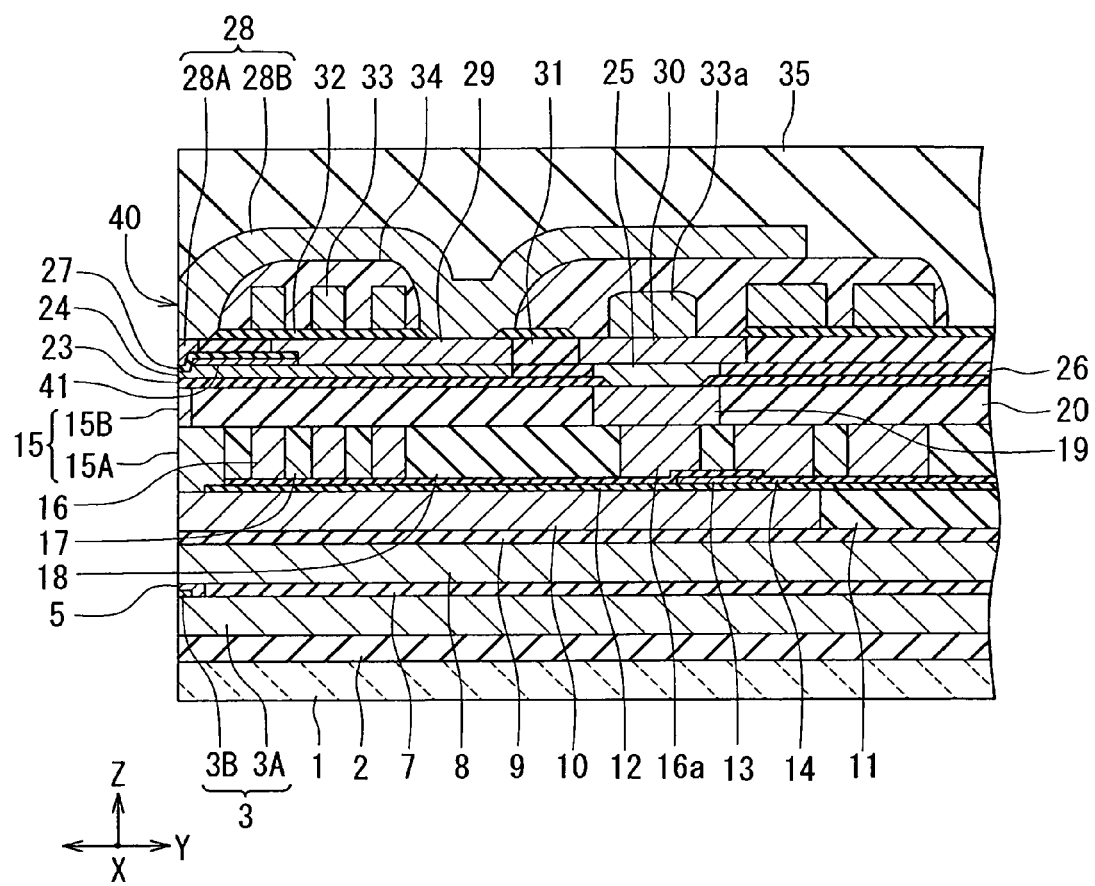
FIG. 3 is a cross-sectional view showing the configuration of a thin-film magnetic head according to the first embodiment of the present invention.
Figure 4:
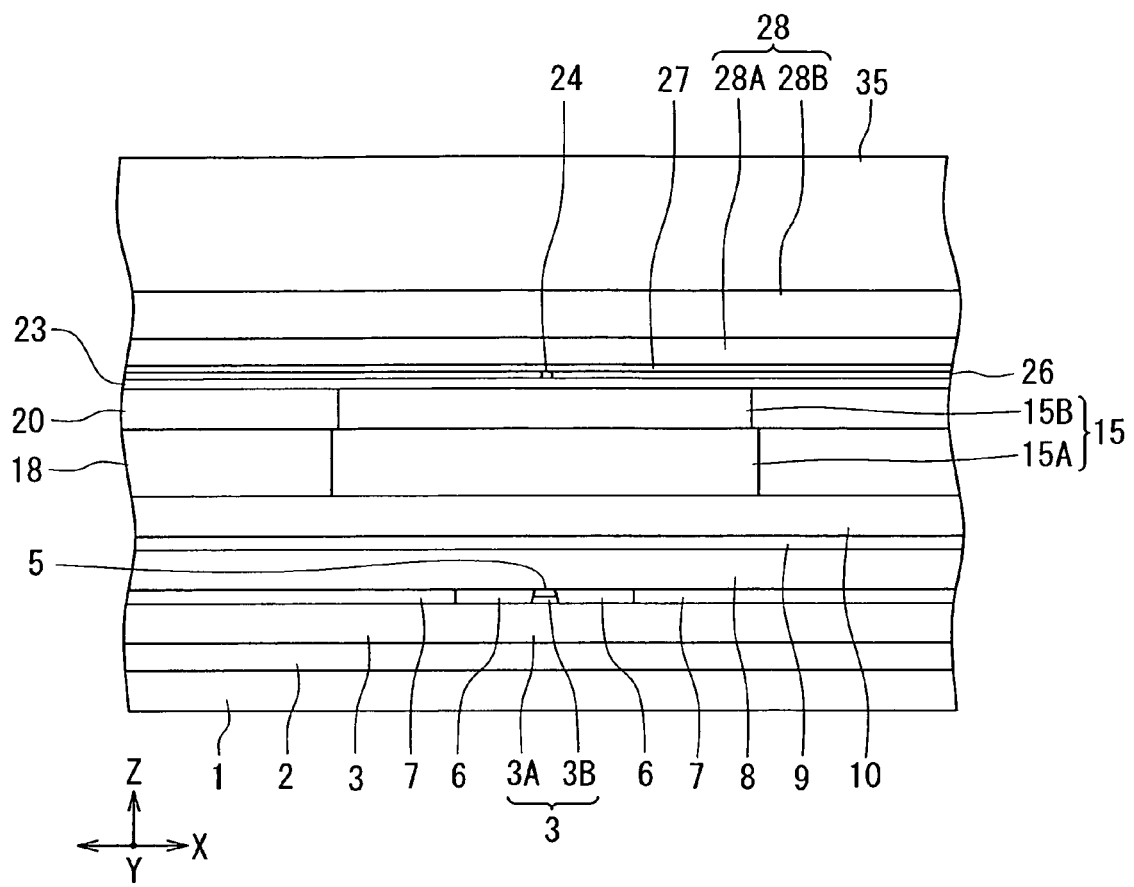
FIG. 4 is a front view showing the medium facing surface of the thin-film magnetic head according to the first embodiment of the present invention.

Reference is now made to FIG. 3 and FIG. 4 to describe the configuration of the thin-film magnetic head according to the present embodiment. FIG. 3 is a cross-sectional view showing the configuration of the thin-film magnetic head. FIG. 4 is a front view showing the medium facing surface of the thin-film magnetic head. Note that FIG. 3 shows a cross section perpendicular to the medium facing surface and the top surface of the substrate. The X, Y and Z directions shown in FIG. 5 are also shown in FIG. 3 and FIG. 4. In FIG. 3 the X direction is orthogonal to the Y and Z directions. In FIG. 4 the Y direction is orthogonal to the X and Z directions.

As shown in FIG. 3, the thin-film magnetic head according to the present embodiment has the medium facing surface 40 that faces toward the recording medium. As shown in FIG. 3 and FIG. 4, the thin-film magnetic head includes: a substrate 1 made of a ceramic material such as aluminum oxide-titanium carbide ($Al_2O_3$—TiC); an insulating layer 2 disposed on the substrate 1; a first read shield 3 made of a magnetic material and disposed on the insulating layer 2; an MR element 5 disposed on the first read shield 3; two bias magnetic field applying layers 6 disposed adjacent to two side surfaces of the MR element 5, respectively, with insulating films (not shown) provided between the MR element 5 and the layers 6; and an insulating layer 7 disposed around the MR element 5 and the bias magnetic field applying layers 6.

The first read shield 3 includes a first layer 3A disposed on the insulating layer 2, and a second layer 3B disposed over the first layer 3A with an insulating film provided therebetween. Each of the first layer 3A and the second layer 3B has an end located in the medium facing surface 40. The MR element 5 has an end located in the medium facing surface 40. The insulating layer 7 is made of an insulating material such as alumina.

The thin-film magnetic head further includes: a second read shield 8 made of a magnetic material and disposed on the MR element 5, the bias magnetic field applying layers 6 and the insulating layer 7; and a separating layer 9 made of a nonmagnetic material such as alumina and disposed on the second read shield 8. The portion from the first read shield 3 to the second read shield 8 constitutes a read head.

The thin-film magnetic head further includes: a magnetic layer 10 made of a magnetic material and disposed on the separating layer 9; and an insulating layer 11 made of an insulating material such as alumina and disposed around the magnetic layer 10. The magnetic layer 10 has an end face located in the medium facing surface 40. The magnetic layer 10 and the insulating layer 11 have flattened top surfaces.

The thin-film magnetic head further includes: an insulating film 12 disposed on the magnetic layer 10 and the insulating layer 11; a heater 13 disposed on the insulating film 12; and an insulating film 14 disposed on the insulating film 12 and the heater 13 such that the heater 13 is sandwiched between the insulating films 12 and 14. The function and material of the heater 13 will be described later. The insulating films 12 and 14 are made of an insulating material such as alumina.

The thin-film magnetic head further includes a first write shield 15 disposed on the magnetic layer 10. The first write shield 15 includes a first layer 15A disposed on the magnetic layer 10, and a second layer 15B disposed on the first layer 15A. The first layer 15A and the second layer 15B are made of a magnetic material. Each of the first layer 15A and the second layer 15B has an end face located in the medium facing surface 40.

The thin-film magnetic head further includes: a coil 16 made of a conductive material and disposed on the insulating film 14; an insulating layer 17 that fills the space between the coil 16 and the first layer 15A and the space between every adjacent turns of the coil 16; and an insulating layer 18 disposed around the first layer 15A, the coil 16 and the insulating layer 17. The coil 16 is planar spiral-shaped. The coil 16 includes a connecting portion 16a that is a portion near an inner end of the coil 16 and connected to another coil described later. The insulating layer 17 is made of photoresist, for example. The insulating layer 18 is made of alumina, for example. The first layer 15A; the coil 16, the insulating layer 17 and the insulating layer 18 have flattened top surfaces.

The thin-film magnetic head further includes: a connecting layer 19 made of a conductive material and disposed on the connecting portion 16a; and an insulating layer 20 made of an insulating material such as alumina and disposed around the second layer 15B and the connecting layer 19. The connecting layer 19 may be made of the same material as the second layer 15B. The second layer 15B, the connecting layer 19 and the insulating layer 20 have flattened top surfaces.

The thin-film magnetic head further includes a first gap layer 23 disposed on the second layer 15B, the connecting layer 19 and the insulating layer 20. The first gap layer 23 has an opening formed in a region corresponding to the top surface of the connecting layer 19. The first gap layer 23 is made of a nonmagnetic insulating material such as alumina.

The thin-film magnetic head further includes: a pole layer 24 made of a magnetic material and disposed on the first gap layer 23; a connecting layer 25 made of a conductive material and disposed on the connecting layer 19; and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as the pole layer 24.

The thin-film magnetic head further includes a nonmagnetic layer 41 made of a nonmagnetic material and disposed on part of the top surface of the pole layer 24. The nonmagnetic layer 41 is made of an inorganic insulating material or a metal material, for example. Examples of the inorganic insulating material to be used for the nonmagnetic layer 41 include alumina and $SiO_2$. Examples of the metal material to be used for the nonmagnetic layer 41 include Ru and Ti.

The thin-film magnetic head further includes a second gap layer 27 disposed on part of the pole layer 24 and on the nonmagnetic layer 41. A portion of the top surface of the pole layer 24 apart from the medium facing surface 40 and the top surface of the connecting layer 25 are not covered with the nonmagnetic layer 41 and the second gap layer 27. The second gap layer 27 is made of a nonmagnetic material such as alumina.

The thin-film magnetic head further includes a second write shield 28 disposed on the second gap layer 27. The second write shield 28 includes a first layer 28A disposed adjacent to the second gap layer 27, and a second layer 28B disposed on a side of the first layer 28A farther from the second gap layer 27 and connected to the first layer 28A. The first layer 28A and the second layer 28B are made of a magnetic material. Each of the first layer 28A and the second layer 28B has an end face located in the medium facing surface 40.

The thin-film magnetic head further includes: a yoke layer 29 made of a magnetic material and disposed on the pole layer 24 at a location apart from the medium facing surface 40; a connecting layer 30 made of a conductive material and disposed on the connecting layer 25; and an insulating layer 31 made of an insulating material such as alumina and disposed around the first layer 28A, the yoke layer 29 and the connecting layer 30. The yoke layer 29 and the connecting layer 30 may be made of the same material as the first layer 28A. The first layer 28A, the yoke layer 29, the connecting layer 30 and the insulating layer 31 have flattened top surfaces.

The thin-film magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a portion of the top surface of the yoke layer 29 near an end thereof farther from the medium facing surface 40, and an opening for exposing the top surface of the connecting layer 30.

The thin-film magnetic head further includes a coil 33 made of a conductive material and disposed on the insulating layer 32. The coil 33 is planar spiral-shaped. The coil 33 includes a connecting portion 33a that is a portion near an inner end of the coil 33 and connected to the connecting portion 16a of the coil 16. The connecting portion 33a is connected to the connecting layer 30, and connected to the connecting portion 16a through the connecting layers 19, 25 and 30.

The thin-film magnetic head further includes an insulating layer 34 disposed to cover the coil 33. The insulating layer 34 is made of photoresist, for example. The second layer 28B of the second write shield 28 is disposed on the first layer 28A, the yoke layer 29 and the insulating layer 34, and connects the first layer 28A and the yoke layer 29 to each other.

The thin-film magnetic head further includes an overcoat layer 35 made of an insulating material such as alumina and disposed to cover the second layer 28B. The portion from the magnetic layer 10 to the second layer 28B constitutes a write head. The base body 211 of FIG. 5 is mainly composed of the substrate 1 and the overcoat layer 35 of FIG. 3.

As has been described, the thin-film magnetic head includes the medium facing surface 40 that faces toward the recording medium, the read head, and the write head. The read head and the write head are stacked on the substrate 1. The read head is disposed backward along the direction of travel of the recording medium (the Z direction) (in other words, disposed closer to an air-inflow end of the slider), while the write head is disposed forward along the direction of travel of the recording medium (the Z direction) (in other words, disposed closer to an air-outflow end of the slider). The thin-film magnetic head writes data on the recording medium through the use of the write head, and reads data stored on the recording medium through the use of the read head.

The read head includes the first read shield 3 and the second read shield 8, and the MR element 5 disposed between the first read shield 3 and the second read shield 8 near the medium facing surface 40 to detect a signal magnetic field sent from the recording medium. The first layer 3A of the first read shield 3 and the second read shield 8 also function as a pair of electrodes for feeding a sense current to the MR element 5. In addition to the first layer 3A and the second read shield 8, a pair of electrodes may be provided on top and bottom of the MR element 5. The MR element 5 exhibits a change in resistance in response to a signal magnetic field sent from the recording medium. The resistance of the MR element 5 is determinable from the sense current. It is thus possible, using the read head, to read data stored on the recording medium.

The write head includes the magnetic layer 10, the first write shield 15, the coil 16, the first gap layer 23, the pole layer 24, the nonmagnetic layer 41, the second gap layer 27, the second write shield 28, the yoke layer 29, and the coil 33. The first write shield 15 is located closer to the substrate 1 than is the second write shield 28. The pole layer 24 is located closer to the substrate 1 than is the second write shield 28.

The coils 16 and 33 generate a magnetic field that corresponds to data to be written on the recording medium. The pole layer 24 has an end face located in the medium facing surface 40, allows a magnetic flux corresponding to the magnetic field generated by the coils 16 and 33 to pass, and generates a write magnetic field used for writing the data on the recording medium by means of a perpendicular magnetic recording system.

The first write shield 15 is made of a magnetic material, and has an end face located in the medium facing surface 40 at a position backward of the end face of the pole layer 24 along the direction of travel of the recording medium (the Z direction) (in other words, located closer to the air-inflow end of the slider). The first gap layer 23 is made of a nonmagnetic material, has an end face located in the medium facing surface 40, and is disposed between the first write shield 15 and the pole layer 24. In the present embodiment, the first write shield 15 includes the first layer 15A disposed on the magnetic layer 10, and the second layer 15B disposed on the first layer 15A. Part of the coil 16 is located on a side of the first layer 15A farther from the medium facing surface 40 so as to pass through the space between the magnetic layer 10 and the pole layer 24.

The magnetic layer 10 has a function of returning a magnetic flux that has been generated from the end face of the pole layer 24 and has magnetized the recording medium. FIG. 3 shows an example in which the magnetic layer 10 has an end face located in the medium facing surface 40. However, since the magnetic layer 10 is connected to the first write shield 15 having an end face located in the medium facing surface 40, the magnetic layer 10 may have an end face that is closer to the medium facing surface 40 and located at a distance from the medium facing surface 40.

In the medium facing surface 40, the end face of the first write shield 15 (the end face of the second layer 15B) is located backward of the end face of the pole layer 24 along the direction of travel of the recording medium (the Z direction) (in other words, located closer to the air-inflow end of the slider) with a predetermined small distance provided therebetween by the first gap layer 23. The distance between the end face of the pole layer 24 and the end face of the first write shield 15 in the medium facing surface 40 is preferably within a range of 0.05 to 0.7 μm, or more preferably within a range of 0.1 to 0.3 μm.

The first write shield 15 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density.

The second write shield 28 is made of a magnetic material, and has an end face located in the medium facing surface 40 at a position forward of the end face of the pole layer 24 along the direction of travel of the recording medium (the Z direction) (in other words, located closer to the air-outflow end of the slider). The second gap layer 27 is made of a nonmagnetic material, has an end face located in the medium facing surface 40, and is disposed between the second write shield 28 and the pole layer 24. In the present embodiment, the second write shield 28 includes the first layer 28A disposed adjacent to the second gap layer 27, and the second layer 28B disposed on a side of the first layer 28A farther from the second gap layer 27 and connected to the first layer 28A. Part of the coil 33 is disposed to pass through the space surrounded by the pole layer 24 and the second write shield 28. The second write shield 28 is connected to a portion of the yoke layer 29 away from the medium facing surface 40. The second write shield 28 is thus connected to a portion of the pole layer 24 away from the medium facing surface 40 through the yoke layer 29. The pole layer 24, the second write shield 28 and the yoke layer 29 form a magnetic path for passing a magnetic flux corresponding to the magnetic field generated by the coil 33.

In the medium facing surface 40, the end face of the second write shield 28 (the end face of the first layer 28A) is located forward of the end face of the pole layer 24 along the direction of travel of the recording medium (the Z direction) (in other words, located closer to the air-outflow end of the slider) with a predetermined small distance provided therebetween by the second gap layer 27. The distance between the end face of the pole layer 24 and the end face of the second write shield 28 in the medium facing surface 40 is preferably equal to or smaller than 200 nm, or more preferably within a range of 25 to 50 nm, so that the second write shield 28 can fully exhibit its function as a shield.

The position of the end of a bit pattern to be written on the recording medium is determined by the position of an end of the pole layer 24 closer to the second gap layer 27 in the medium facing surface 40. The second write shield 28 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density. Furthermore, the second write shield 28 takes in a disturbance magnetic field applied from outside the thin-film magnetic head to the thin-film magnetic head. It is thereby possible to prevent erroneous writing on the recording medium caused by the disturbance magnetic field intensively taken into the pole layer 24. The second write shield 28 also has a function of returning a magnetic flux that has been generated from the end face of the pole layer 24 and has magnetized the recording medium.

FIG. 3 shows an example in which neither the magnetic layer 10 nor the first write shield 15 is connected to the pole layer 24. However, the magnetic layer 10 may be connected to a portion of the pole layer 24 away from the medium facing surface 40. The coil 16 is not an essential component of the write head and can be dispensed with. In the example shown in FIG. 3, the yoke layer 29 is disposed on the pole layer 24, or in other words, disposed forward of the pole layer 24 along the direction of travel of the recording medium (the Z direction) (or in still other words, disposed closer to the air-outflow end of the slider). However, the yoke layer 29 may be disposed below the pole layer 24, or in other words, disposed backward of the pole layer 24 along the direction of travel of the recording medium (the Z direction) (or in still other words, disposed closer to the air-inflow end of the slider).

The heater 13 is provided for heating the components of the write head including the pole layer 24 so as to control the distance between the recording medium and the end face of the pole layer 24 located in the medium facing surface 40. Two leads that are not shown are connected to the heater 13. For example, the heater 13 is formed of a NiCr film or a layered film made up of a Ta film, a NiCu film and a Ta film. The heater 13, generates heat by being energized through the two leads, and thereby heats the components of the write head. As a result, the components of the write head expand and the end face of the pole layer 24 located in the medium facing surface 40 thereby gets closer to the recording medium.

Two of the six terminals 212 provided in the slider 210 shown in FIG. 5 are connected to the first layer 3A of the first read shield 3 and the second read shield 8, respectively. Other two of the six terminals 212 are connected to the coils 16 and 33, and the remaining two of the terminals 212 are connected to the two leads connected to the heater 13.

While FIG. 3 and FIG. 4 show a write head for a perpendicular magnetic recording system, the write head of the present embodiment may be one for a longitudinal magnetic recording system.

A method of manufacturing the thin-film magnetic head according to the present embodiment will now be outlined. In the method of manufacturing the thin-film magnetic head according to the embodiment, components of a plurality of thin-film magnetic heads are first formed on a single substrate (wafer) to thereby fabricate a substructure in which pre-slider portions each of which will be later formed into a slider are aligned in a plurality of rows. Next, the substructure is cut into a slider aggregate including a plurality of pre-slider portions aligned in a row. Next, a surface formed in the slider aggregate by cutting the substructure is polished to thereby form the medium facing surfaces 40 of the pre-slider portions included in the slider aggregate. Next, flying rails are formed in the medium facing surfaces 40. Next, the slider aggregate is cut to separate the plurality of pre-sider portions from one another. A plurality of sliders each of which includes the thin-film magnetic head are thereby formed.

Figure 1:
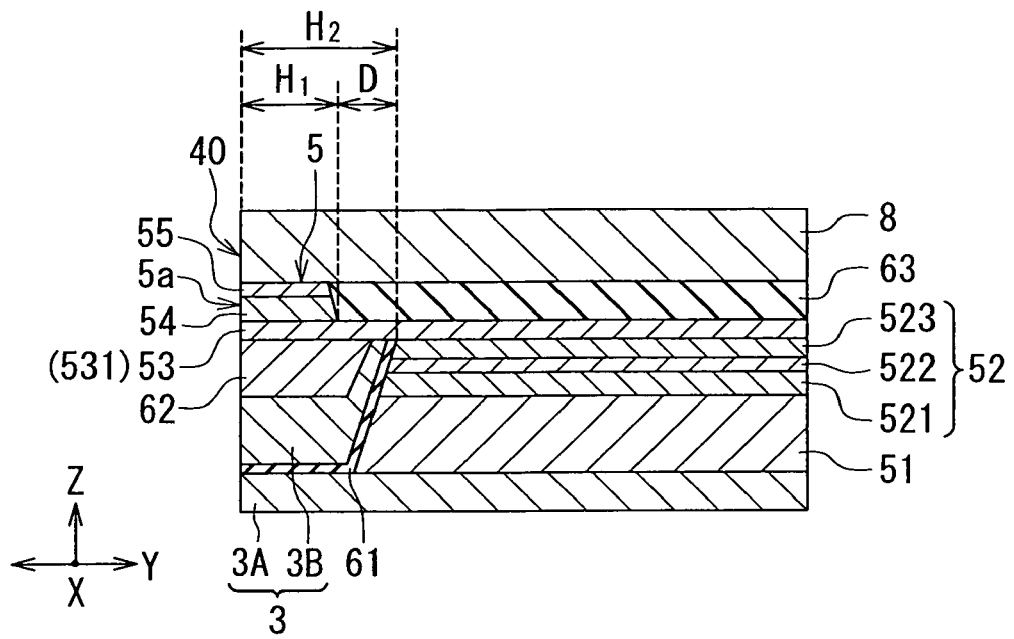
FIG. 1 is a cross-sectional view of a read head including a magnetoresistive element according to a first embodiment of the present invention.
Figure 2:
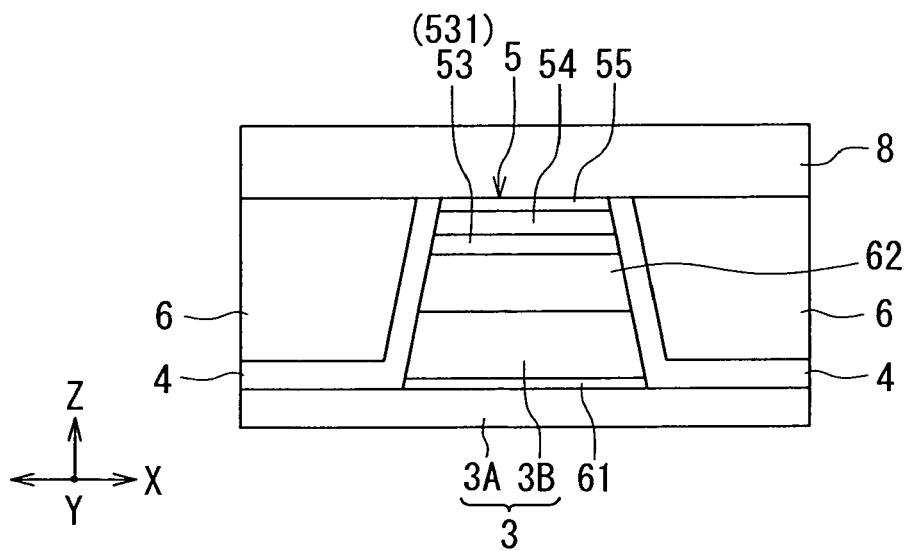
FIG. 2 is a front view of the read head of FIG. 1.

Reference is now made to FIG. 1 and FIG. 2 to describe in detail the configurations of the MR element 5 and the read head according to the present embodiment. FIG. 1 is a cross-sectional view of the read head. FIG. 2 is a front view of the read head. The X, Y and Z directions shown in FIG. 5 are also shown in FIG. 1 and FIG. 2. In FIG. 1 the X direction is orthogonal to the Y and Z directions. In FIG. 2 the Y direction is orthogonal to the X and Z directions.

The read head includes: the first read shield 3 and the second read shield 8 disposed at a predetermined distance from each other; the MR element 5 disposed between the read shields 3 and 8; insulating films 4; the two bias magnetic field applying layers 6 for applying a bias magnetic field to the MR element 5, which are disposed adjacent to the two side surfaces of the MR element 5, respectively, with the insulating films 4 located between the MR element 5 and the layers 6; and the insulating layer 7 (see FIG. 3) disposed around the MR element 5 and the bias magnetic field applying layers 6. The bias magnetic field applying layers 6 generate a bias magnetic field in the track width direction. The read shields 3 and 8 extend in a direction intersecting the medium facing surface 40.

The first read shield 3 includes the first layer 3A and the second layer 3B. As shown in FIG. 2, the insulating films 4 are disposed respectively between the side surface of each of the MR element 5 and the second layer 3B and the bias magnetic field applying layers 6, and between the first layer 3A and the bias magnetic field applying layers 6. Each of the shields 3 and 8 and the bias magnetic field applying layers 6 has an end face located in the medium facing surface 40. The first read shield 3 corresponds to the first shield of the present invention, and the second read shield 8 corresponds to the second shield of the present invention.

The read shields 3 and 8 are each made of a soft magnetic material such as NiFe, CoFe, CoFeB, CoFeNi, or FeN. The bias magnetic field applying layers 6 are formed of a hard magnetic layer or a stack of a ferromagnetic layer and an antiferromagnetic layer, for example. To be specific, the bias magnetic field applying layers 6 are formed of CoPt or CoCrPt, for example. The insulating films 4 and the insulating layer 7 are formed of alumina, for example.

The MR element 5 includes: a detection surface 5a that is located in the medium facing surface 40 and that receives a signal magnetic field sent from the recording medium, which is a magnetic field to be detected; an antiferromagnetic layer 51; a pinned layer 52; a coupling portion 53; a free layer 54;

and a protection layer 55. The antiferromagnetic layer 51 is away from the detection surface 5a and disposed on the first layer 3A. The pinned layer 52 is away from the detection surface 5a and disposed on the antiferromagnetic layer 51. The pinned layer 52 is a ferromagnetic layer made of a ferromagnetic material and having a fixed magnetization direction. The antiferromagnetic layer 51 is a layer for fixing the magnetization direction of the pinned layer 52 by means of exchange coupling to the pinned layer 52.

The antiferromagnetic layer 51 is formed of an antiferromagnetic material containing Mn and at least one element $M_{II}$ selected from the group consisting of Pt, Ru, Rh, Pd, Ni, Cu, Ir, Cr and Fe, for example. The Mn content of the material is preferably equal to or higher than 35 atomic percent and lower than or equal to 95 atomic percent, while the content of the other element $M_{II}$ of the material is preferably equal to or higher than 5 atomic percent and lower than or equal to 65 atomic percent. Examples of the antiferromagnetic material include a non-heat-induced antiferromagnetic material and a heat-induced antiferromagnetic material. The non-heat-induced antiferromagnetic material exhibits antiferromagnetism without any heat treatment and induces an exchange coupling magnetic field between a ferromagnetic material and itself. The heat-induced antiferromagnetic material exhibits antiferromagnetism by undergoing heat treatment. The antiferromagnetic layer 51 can be formed of either of these. Examples of the non-heat-induced antiferromagnetic material include a Mn alloy that has a γ phase, such as RuRhMn, FeMn, or IrMn. Examples of the heat-induced antiferromagnetic material include a Mn alloy that has a regular crystal structure, such as PtMn, NiMn, or PtRhMn.

FIG. 1 illustrates an example in which the pinned layer 52 is a "synthetic" pinned layer. The pinned layer 52 includes a first ferromagnetic layer 521, a nonmagnetic interlayer 522 and a second ferromagnetic layer 523 that are stacked in this order on the antiferromagnetic layer 51. Each of the first ferromagnetic layer 521 and the second ferromagnetic layer 523 is made of a ferromagnetic material such as CoFe or NiFe. The nonmagnetic interlayer 522 is made of a nonmagnetic conductive material and provided for the purpose of antiferromagnetically coupling the first and second ferromagnetic layers 521 and 523 to each other via the RKKY interaction. The nonmagnetic interlayer 522 is made of Ru, Rh, Ir, Re, Cr, Zr or Cu, for example.

A stack consisting of the antiferromagnetic layer 51 and the pinned layer 52 has an end face located closer to the detection surface 5a. The read head further includes an insulating film 61 that covers the end face of the above-mentioned stack located closer to the detection surface 5a and also a portion of the top surface of the first layer 3A between the above-mentioned stack and the detection surface 5a. The insulating film 61 may be made of a typical insulating material such as alumina, $SiO_2$ or MgO. The second layer 3B is disposed on the insulating film 61 and is adjacent to the top surface of the first layer 3A and the end face of the above-mentioned stack located closer to the detection surface 5a, with the insulating film 61 disposed between the second layer 3B and each of the first layer 3A and the above-mentioned stack.

The read head further includes a nonmagnetic conductive layer 62 disposed on the second layer 3B. The nonmagnetic conductive layer 62 is made of Ta, for example. The pinned layer 52, the insulating film 61, the second layer 3B and the nonmagnetic conductive layer 62 have flattened top surfaces.

The coupling portion 53 is disposed on the flattened top surfaces of the pinned layer 52, the insulating film 61, the second layer 3B and the nonmagnetic conductive layer 62.

The coupling portion 53 has an end face located in the detection surface 5a. The coupling portion 53 is made of a nonmagnetic material. The coupling portion 53 includes a nonmagnetic conductive layer 531 that allows electrons to be conducted while conserving their spins. In the present embodiment, in particular, the coupling portion 53 consists only of the nonmagnetic conductive layer 531 that allows electrons to be conducted while conserving their spins. The material of the nonmagnetic conductive layer 531 is a nonmagnetic metal or a carbon material having a graphene structure, for example. The coupling portion 53 will be described in detail later.

The free layer 54 is disposed on the coupling portion 53. The free layer 54 has an end face located in the detection surface 5a. The free layer 54 is made of a ferromagnetic material such as CoFe or NiFe. The free layer 54 exhibits a change in magnetization direction in response to a signal magnetic field, which is a magnetic field to be detected.

The protection layer 55 is disposed on the free layer 54. The protection layer 55 has an end face located in the detection surface 5a. The protection layer 55 is a layer for protecting the free layer 54. The protection layer 55 is made of Ta, for example. The read head further includes an insulating layer 63 disposed around the free layer 54 and the protection layer 55. The insulating layer 63 may be made of a typical insulating material such as alumina, $SiO_2$ or MgO. Alternatively, the insulating layer 63 may be formed of an air layer or a vacuum cavity. Air or a vacuum does not disturb the electronic state of a carbon material having a graphene structure. Forming the insulating layer 63 of an air layer or a vacuum cavity is therefore preferable especially when the nonmagnetic conductive layer 531 is formed of a carbon material having a graphene structure. The insulating layer 63 made of an air layer or a vacuum cavity may be formed through a sacrificial layer etching technique used in a manufacturing method of MEMS (microelectro mechanical systems), for example, in the following manner. First, a sacrificial layer of $SiO_2$, for example, is formed on a portion to be the insulating layer 63. Next, the second read shield 8 as a layer above the insulating layer 63 is formed, and then a hole communicating to the sacrificial layer is formed in the second read shield 8. Next, the sacrificial layer is etched using, e.g., a reactive gas, to thereby form a cavity in the portion to be the insulating layer 63. Next, the cavity is filled with air or made vacuum and the hole is closed.

A stack consisting of the antiferromagnetic layer 51, the pinned layer 52, the insulating film 61, the second layer 3B, the nonmagnetic conductive layer 62, the coupling portion 53, the free layer 54, the protection layer 55 and the insulating layer 63 has two side surfaces that are located at opposite ends in the track width direction (the X direction), as shown in FIG. 2. The insulating films 4 cover the two side surfaces of this stack and portions of the top surface of the first layer 3A located on the opposite sides of this stack in the track width direction. The two bias magnetic field applying layers 6 are located adjacent to the two side surfaces of the above-mentioned stack and the portions of the top surface of the first layer 3A located on the opposite sides of the stack in the track width direction, with the insulating films 4 disposed in between.

As shown in FIG. 1 and FIG. 2, the protection layer 55, the insulating films 4, the bias magnetic field applying layers 6 and the insulating layer 63 have flattened top surfaces. The second read shield 8 is disposed on these flattened top surfaces.

The bias magnetic field applying layers 6 generate a bias magnetic field in the track width direction (the X direction).

Because of this bias magnetic field, the magnetization direction of the free layer 54 is in the track width direction when no signal magnetic field is applied. The magnetization direction of the pinned layer 52 is fixed to the direction orthogonal to the detection surface 5a (the Y direction).

As shown in FIG. 1, the pinned layer 52 has a top surface that touches the coupling portion 53 while the free layer 54 has a bottom surface that touches the coupling portion 53. Here, the distance between the detection surface 5a and an end of the bottom surface of the free layer 54 touching the coupling portion 53 that is farthest from the detection surface 5a is defined as $H_1$. The distance between the detection surface 5a and an end of the top surface of the pinned layer 52 touching the coupling portion 53 that is closest to the detection surface 5a is defined as $H_2$. The distance $H_2$ is greater than the distance $H_1$. The difference D between the distance $H_2$ and the distance $H_1$ is equal to or smaller than the spin diffusion length of the nonmagnetic conductive layer 531 that constitutes the coupling portion 53. The spin diffusion length means a distance over which an electron is capable of moving while conserving its spin. The distance $H_1$ is within a range of 50 to 200 nm, for example. The distance $H_2$ is within a range of 100 to 1000 nm, for example. The difference D is within a range of 50 to 950 nm, for example.

The coupling portion 53 will now be described in detail. The nonmagnetic conductive layer 531 that constitutes the coupling portion 53 is made of a nonmagnetic metal or a carbon material having a graphene structure, for example. The nonmagnetic metal may be Al or Cu, for example. The spin diffusion length of Al or Cu is approximately 100 nm. As the carbon material having a graphene structure, a graphene thin film or a carbon nanotube, for example, may be used. Typically, the spin diffusion length of a carbon material having a graphene structure is longer than that of a nonmagnetic metal. In particular, a graphene thin film has a long spin diffusion length. Although the spin diffusion length value of a graphene thin film that is currently recognized is approximately 1 µm, it is theoretically expected that the spin diffusion length of a graphene thin film is of a greater value.

The greater the difference D shown in FIG. 1, the higher is the degree of flexibility in placement of the constituents of the MR element 5. In order to increase the difference D, it is preferable that the spin diffusion length of the nonmagnetic conductive layer 531 be longer. Therefore, the nonmagnetic conductive layer 531 is preferably formed of a carbon material having a graphene structure, and more preferably of a graphene thin film. When a carbon nanotube is selected as the material of the nonmagnetic conductive layer 531, it is preferable that the nonmagnetic conductive layer 531 be formed of a plurality of carbon nanotubes aligned such that their center axes are oriented to the direction orthogonal to the detection surface 5a.

The operation of the MR element 5 according to the present embodiment will now be described. A sense current is fed to the MR element 5 through the first layer 3A of the first read shield 3 and the second read shield 8. This sense current passes through the antiferromagnetic layer 51, the pinned layer 52, the coupling portion 53, the free layer 54 and the protection layer 55. The resistance of the MR element 5 is determinable from the sense current. Since the insulating film 61 is provided between the second layer 3B and each of the first layer 3A, the antiferromagnetic layer 51 and the pinned layer 52, the sense current cannot flow via the second layer 3B and the nonmagnetic conductive layer 62.

The magnetization direction of the free layer 54 changes in response to a signal magnetic field sent from the recording medium, whereas the magnetization direction of the pinned layer 52 remains unchanged. The nonmagnetic conductive layer 531 constituting the coupling portion 53 allows electrons to be conducted while conserving their spins between the free layer 54 and the pinned layer 52. Consequently, according to the same principle as that for a typical CPP-structure GMR element, the MR element 5 exhibits variations in resistance depending on the relative angle between the magnetization direction of the pinned layer 52 and the magnetization direction of the free layer 54. It is therefore possible to detect a signal magnetic field by detecting the resistance of the MR element 5.

Reference is now made to FIG. 9A to FIG. 19A and FIG. 9B to FIG. 19B to describe a method of fabricating the read head, including the MR element 5, according to the present embodiment. FIG. 9A to FIG. 19A each show a cross section of a stack of layers formed in the course of fabricating the read head, the cross section being perpendicular to the medium facing surface and the top surface of the substrate. FIG. 9B to FIG. 19B each show a cross section of the stack of layers taken at a position at which the medium facing surface is to be formed. The substrate 1 and the insulating layer 2 are omitted in FIG. 9A to FIG. 19A and FIG. 9B to FIG. 19B. In FIG. 9A to FIG. 19A the broken line with "ABS" indicates the position at which the medium facing surface 40 is to be formed. Each of FIG. 9A to FIG. 19A omits the portion located to the left of the position ABS at which the medium facing surface 40 is to be formed.

Figure 9A:
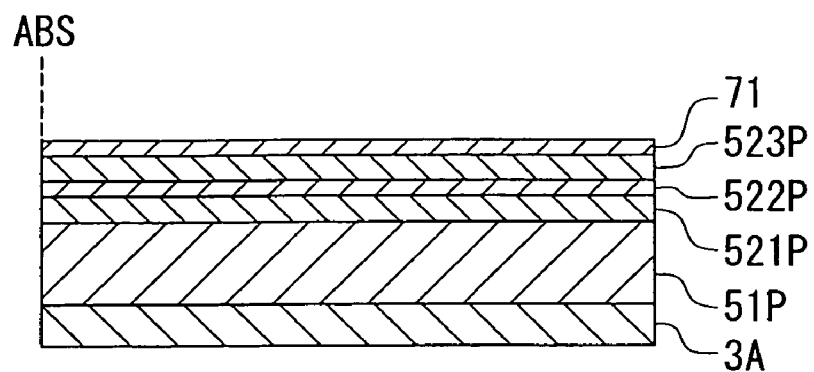
FIG. 9A and FIG. 9B are illustrative views showing a step of a method of fabricating the read head including the magnetoresistive element according to the first embodiment of the present invention.
Figure 9B:
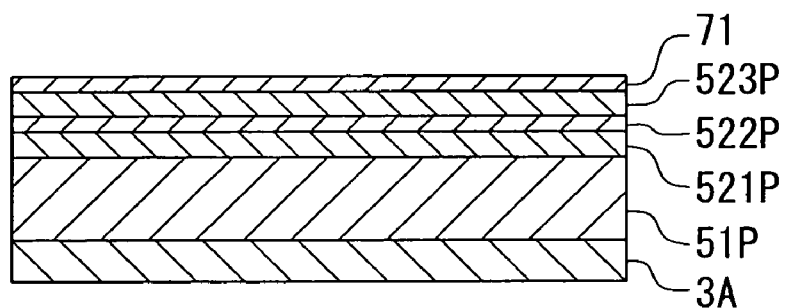

FIG. 9A and FIG. 9B show a step of the method of fabricating the read head. In this step, first, the first layer 3A of the first read shield 3 is formed on the insulating layer 2 by, e.g., frame plating. Next, films 51P, 521P, 522P, 523P and a nonmagnetic conductive layer 71 are formed in succession on the first layer 3A by, e.g., sputtering. The films 51P, 521P, 522P and 523P will be patterned later to thereby become the antiferromagnetic layer 51, the first ferromagnetic layer 521, the nonmagnetic interlayer 522 and the second ferromagnetic layer 523, respectively. The nonmagnetic conductive layer 71 is formed of Ta, for example.

Figure 10A:
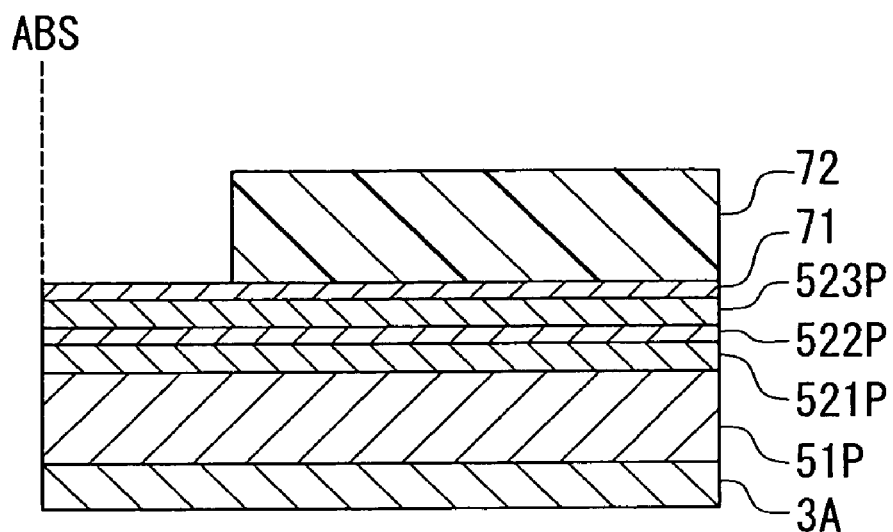
FIG. 10A and FIG. 10B are illustrative views showing a step that follows the step of FIG. 9A and FIG. 9B.
Figure 10B:
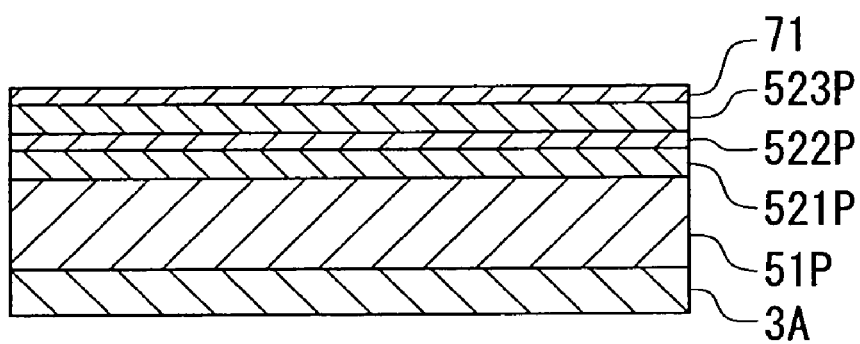

FIG. 10A and FIG. 10B show the next step. In this step, a mask 72 is formed on the stack of layers shown in FIG. 9A to FIG. 9B. The mask 72 has an opening formed in a region in which the insulating film 61, the second layer 3B of the first read shield 3 and the nonmagnetic conductive layer 62 are to be disposed. The mask 72 is formed by patterning a photoresist layer through photolithography, for example.

Figure 11A:
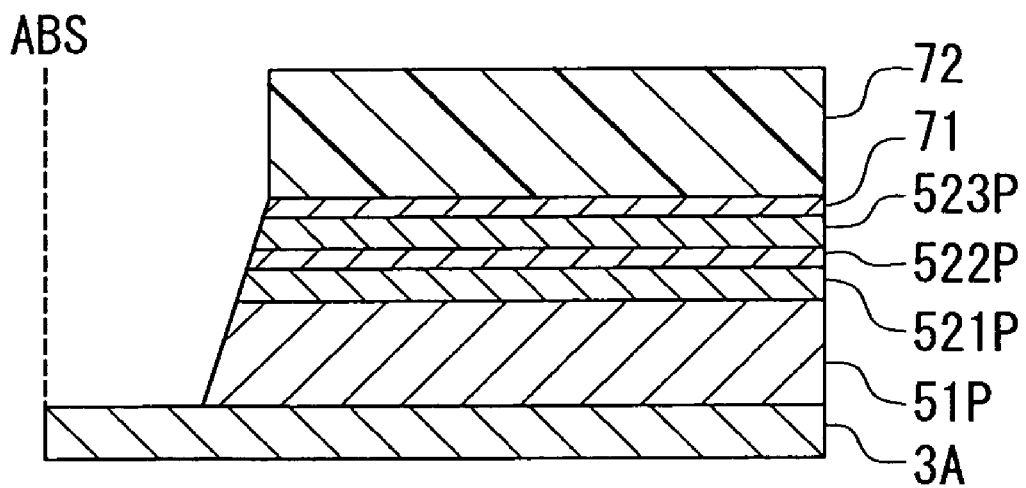
FIG. 11A and FIG. 11B are illustrative views showing a step that follows the step of FIG. 10A and FIG. 10B.
Figure 11B:
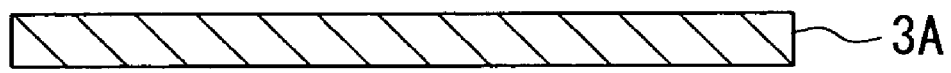

FIG. 11A and FIG. 11B show the next step. In this step, the layered film consisting of the films 51P, 521P, 522P, 523P and the nonmagnetic conductive layer 71 is selectively etched by dry etching at the portion corresponding to the opening of the mask 72. A groove is thereby formed in the above-mentioned layered film in the region in which the insulating film 61, the second layer 3B of the first read shield 3 and the nonmagnetic conductive layer 62 are to be disposed.

Figure 12A:
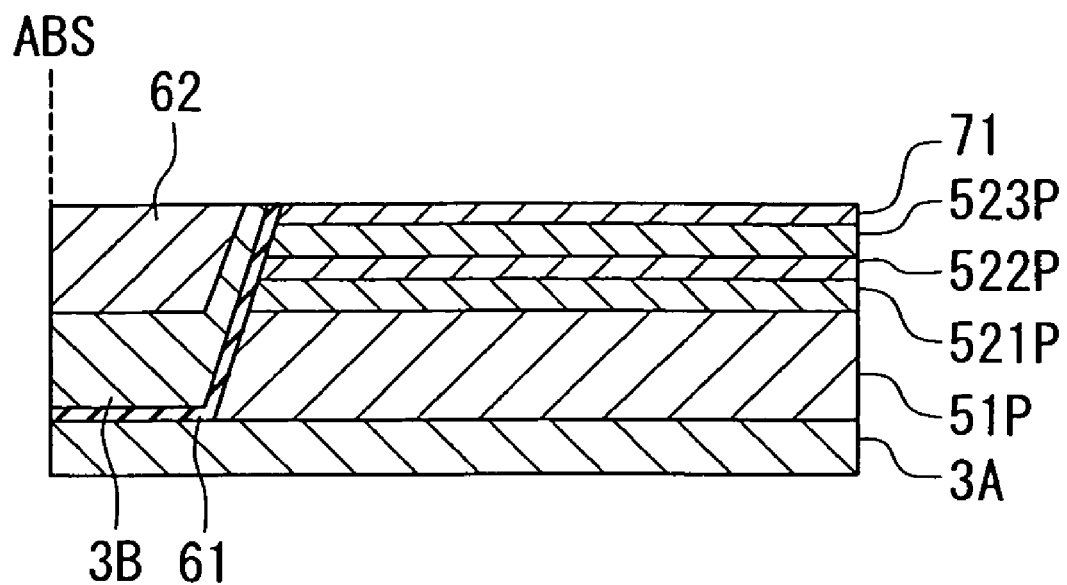
FIG. 12A and FIG. 12B are illustrative views showing a step that follows the step of FIG. 11A and FIG. 11B.
Figure 12B:
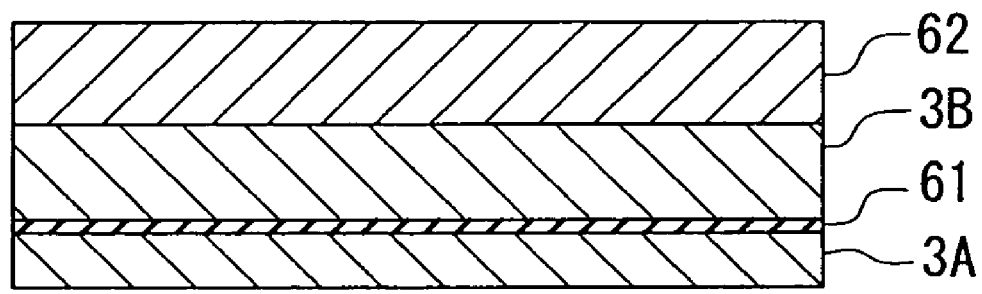

FIG. 12A and FIG. 12B show the next step. In this step, first, the insulating film 61, the second layer 3B of the first read shield 3 and the nonmagnetic conductive layer 62 are formed in succession to fill the above-mentioned groove by, e.g., sputtering, with the mask 72 left unremoved. Then, the mask 72 is lifted off.

Figure 13A:
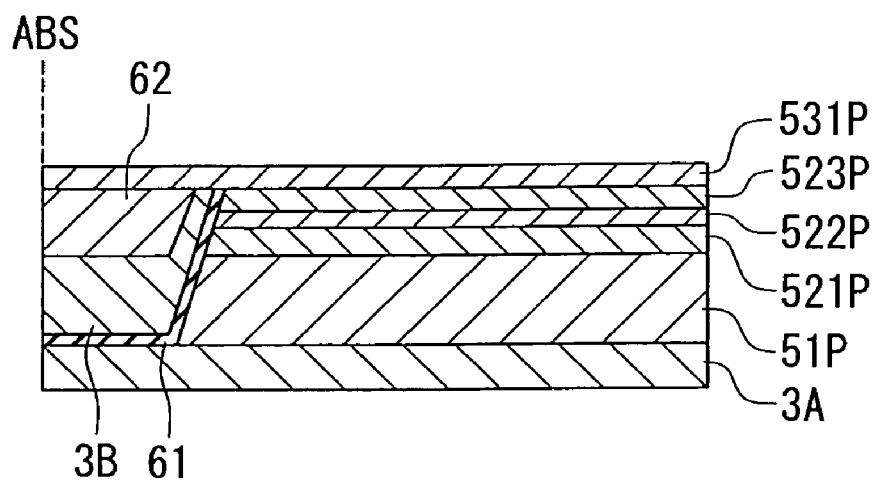
FIG. 13A and FIG. 13B are illustrative views showing a step that follows the step of FIG. 12A and FIG. 12B.
Figure 13B:
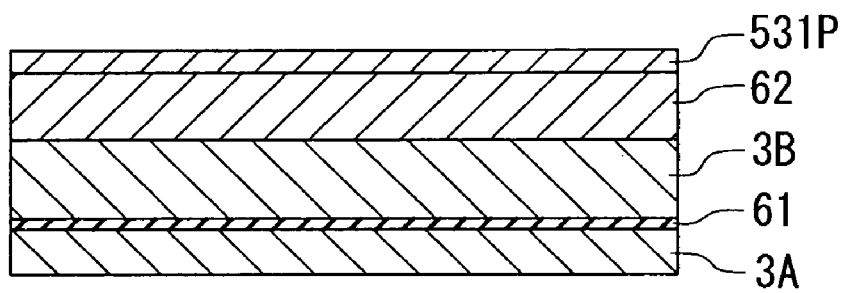

FIG. 13A and FIG. 13B show the next step. In this step, first, the top surface of the stack of layers shown in FIG. 12A and FIG. 12B is polished by, e.g., chemical mechanical polishing (hereinafter referred to as CMP), until the film 523P is exposed. Next, a film 531P is formed on the top surface of the stack after the polishing. The film 531P will be patterned later to thereby become the nonmagnetic conductive layer 531. In the case of forming the nonmagnetic conductive layer 531 of a nonmagnetic metal, the film 531P is formed by sputtering, for example. In the case of forming the nonmagnetic conductive layer 531 of a grapheme thin film, the film 531P is formed by, for example, spin-coating with a solution prepared by dispersing graphene in a solvent. As an alternative method, the film 531P may be formed through bonding plate-shaped graphite to the top surface of the stack and then exfoliating a plurality of layers of graphene from the graphite with an adhesive tape. As another alternative method, the film 531P may be formed through exfoliating a graphene thin film from graphite with an adhesive tape and then transferring it to the top surface of the stack.

Figure 14A:
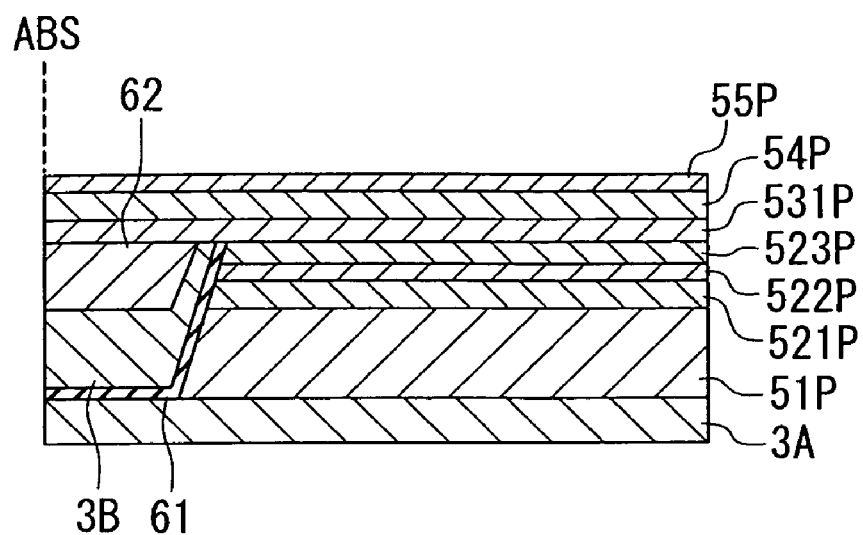
FIG. 14A and FIG. 14B are illustrative views showing a step that follows the step of FIG. 13A and FIG. 13B.
Figure 14B:
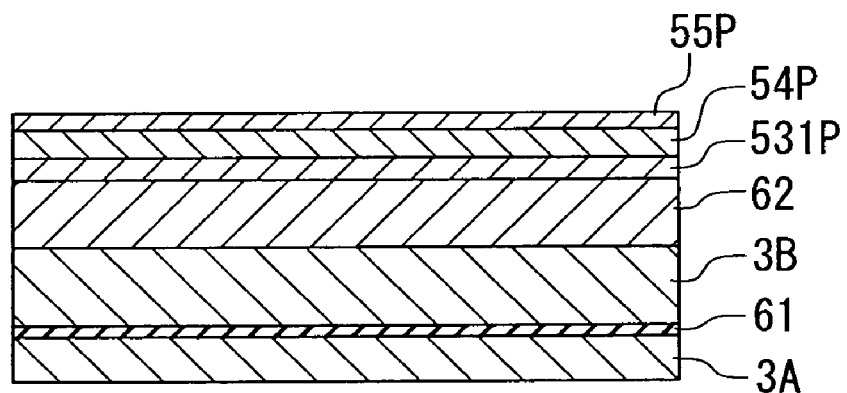

FIG. 14A and FIG. 14B show the next step. In this step, films 54P and 55P are formed in succession on the film 531P by, e.g., sputtering. The films 54P and 55P will be patterned later to thereby become the free layer 54 and the protection layer 55, respectively.

Figure 15A:
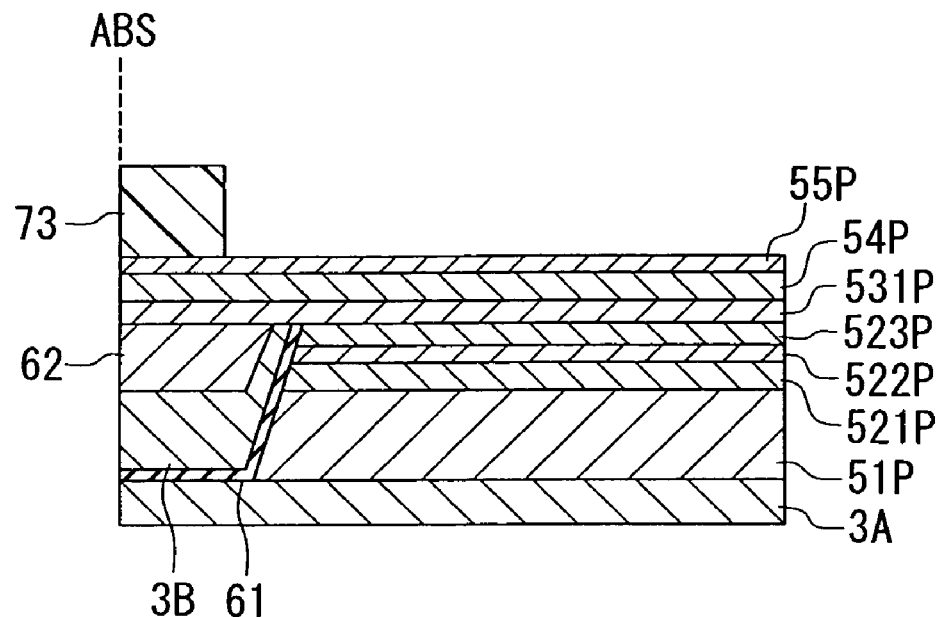
FIG. 15A and FIG. 15B are illustrative views showing a step that follows the step of FIG. 14A and FIG. 14B.
Figure 15B:
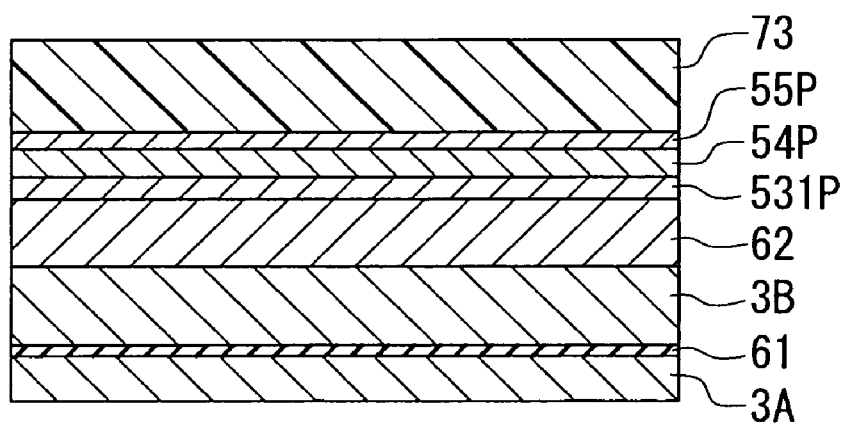

FIG. 15A and FIG. 15B show the next step. In this step, a mask 73 is formed on the stack of layers shown in FIG. 14A and FIG. 14B. The mask 73 is intended for use for forming, in the films 54P and 55P, respective end faces of the free layer 54 and the protection layer 55 located farther from the detection surface 5a. The mask 73 is formed by patterning a photoresist layer through photolithography, for example.

Figure 16A:
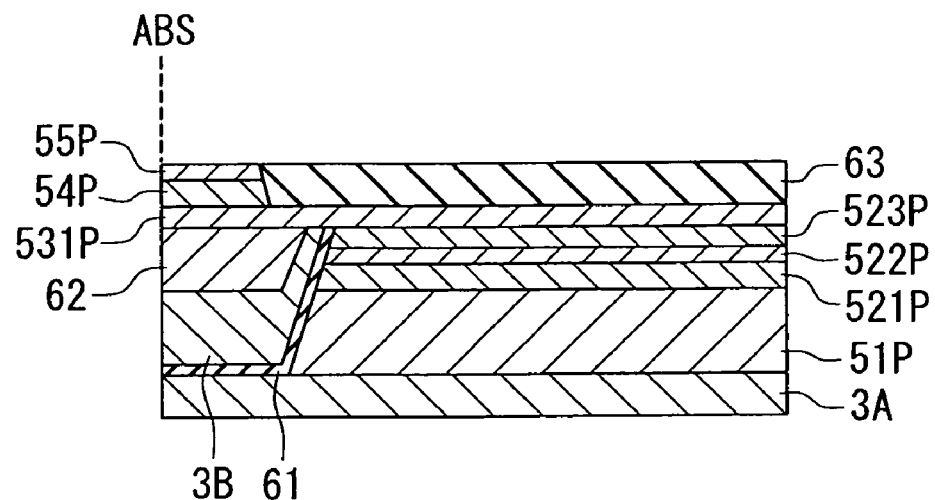
FIG. 16A and FIG. 16B are illustrative views showing a step that follows the step of FIG. 15A and FIG. 15B.
Figure 16B:
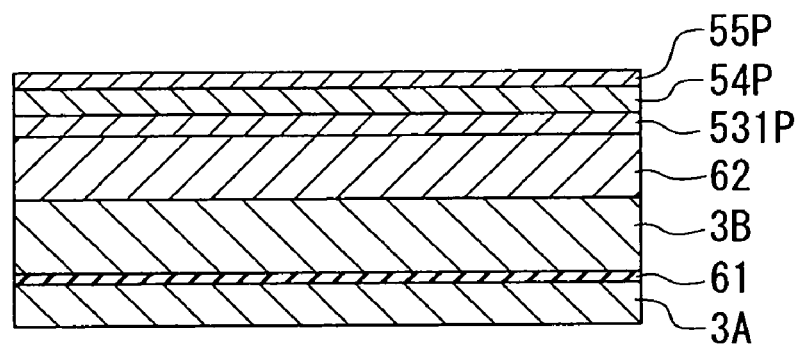

FIG. 16A and FIG. 16B show the next step. In this step, first, the films 54P and 55P are selectively etched by dry etching through the use of the mask 73. The respective end faces of the free layer 54 and the protection layer 55 farther from the detection surface 5a are thereby formed in the films 54P and 55P. Next, the insulating layer 63 is formed by, e.g., sputtering, with the mask 73 left unremoved. The mask 73 is then lifted off.

Figure 17A:
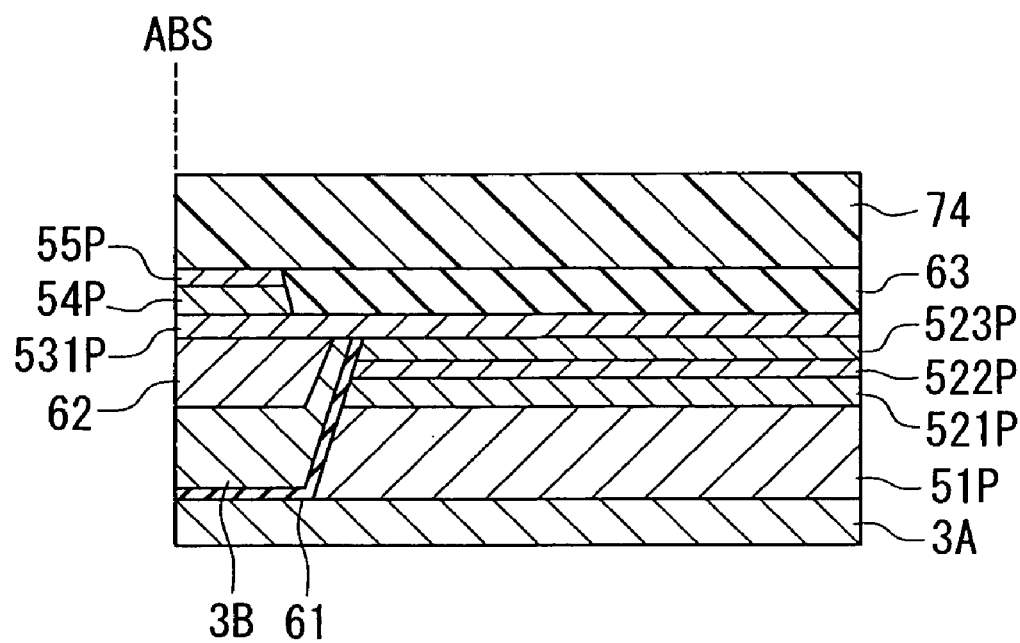
FIG. 17A and FIG. 17B are illustrative views showing a step that follows the step of FIG. 16A and FIG. 16B.
Figure 17B:
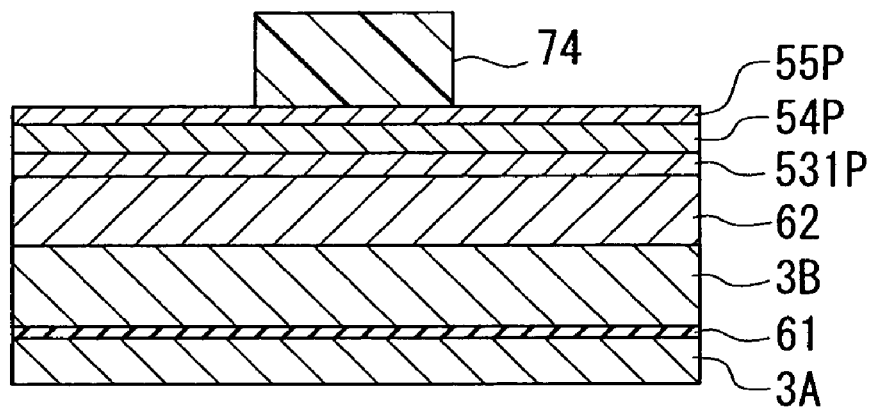

FIG. 17A and FIG. 17B show the next step. In this step, a mask 74 for determining the width of the MR element 5 is formed on the stack of layers shown in FIG. 16A and FIG. 16B. The mask 74 is formed by patterning a photoresist layer through photolithography, for example.

Figure 18A:
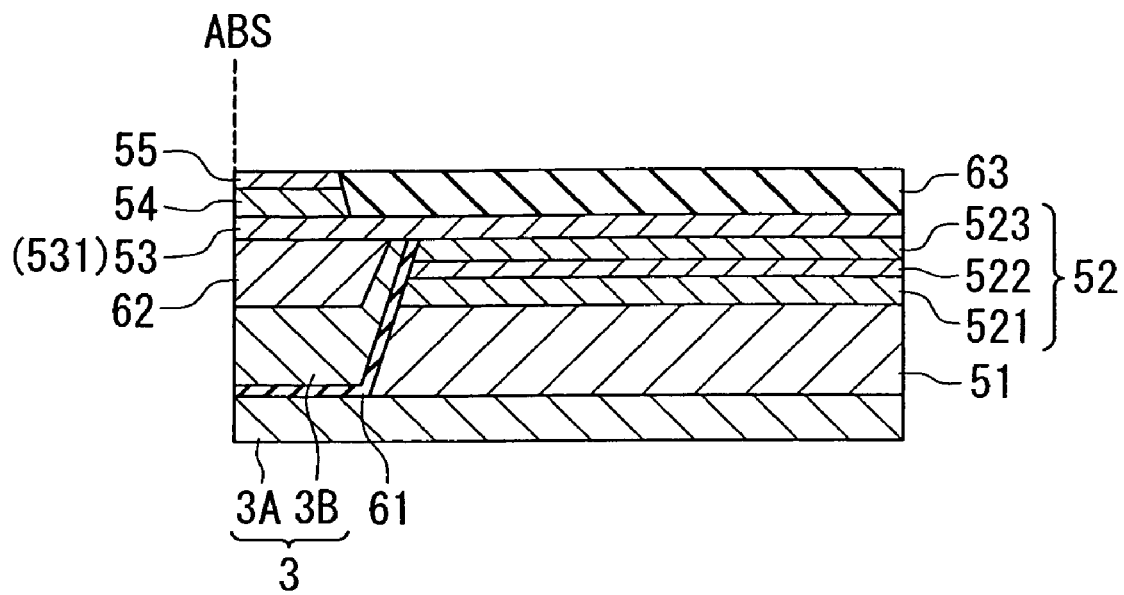
FIG. 18A and FIG. 18B are illustrative views showing a step that follows the step of FIG. 17A and FIG. 17B.
Figure 18B:
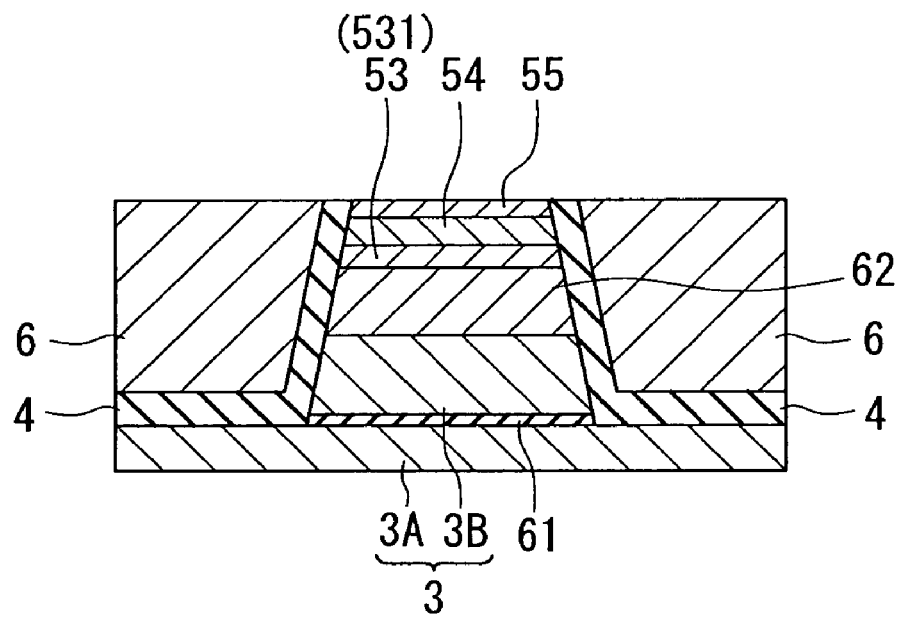

FIG. 18A and FIG. 18B show the next step. In this step, first, the layered film located on the first layer 3A is selectively etched by dry etching through the use of the mask 74. This provides the layered film with two side surfaces. Next, the insulating films 4 and the bias magnetic field applying layers 6 are formed by, e.g., sputtering, with the mask 74 left unremoved. The mask 74 is then lifted off.

Figure 19A:
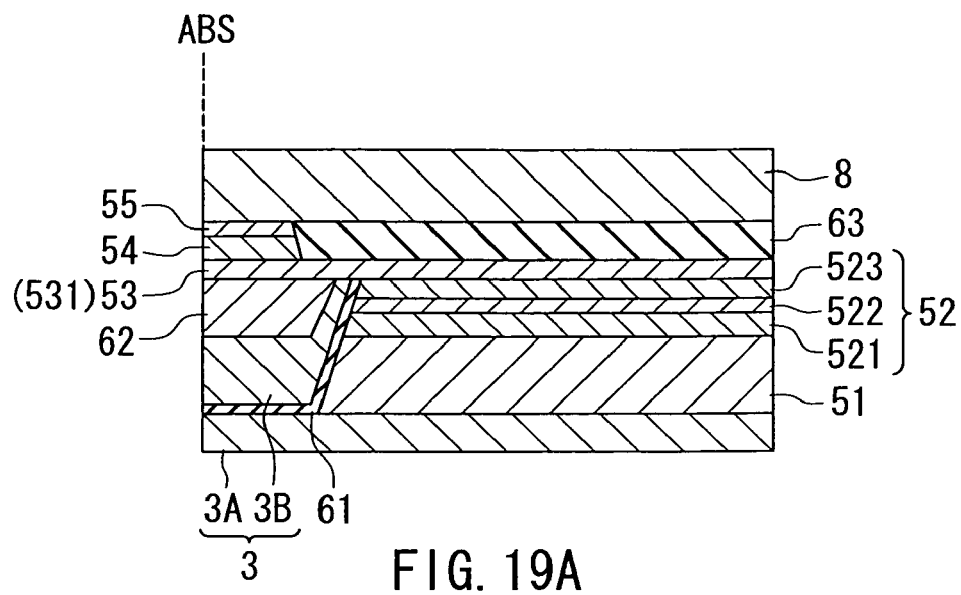
FIG. 19A and FIG. 19B are illustrative views showing a step that follows the step of FIG. 18A and FIG. 18B.
Figure 19B:
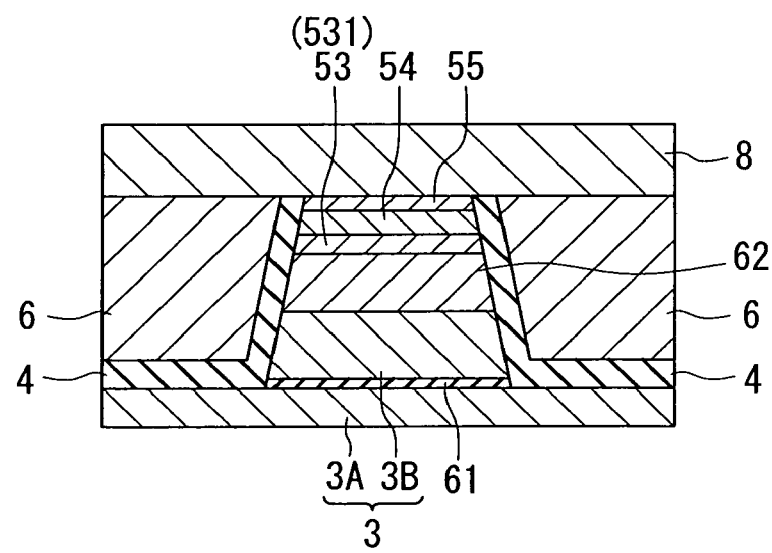

FIG. 19A and FIG. 19B show the next step. In this step, the second read shield 8 is formed on the stack of layers shown in FIG. 18A and FIG. 18B by, e.g., frame plating.

The stack of layers shown in FIG. 19A and FIG. 19B will be polished later from the left side of FIG. 19A to a level indicated with "ABS" when polishing for forming the medium facing surface 40 is performed. As a result, the medium facing surface 40 and the detection surface 5a are formed and the read head is thereby completed.

In the MR element 5 according to the present embodiment, electrons are conducted by the nonmagnetic conductive layer 531 between the free layer 54 and the pinned layer 52 with the spins of the electrons conserved. It is thus possible to produce a magnetoresistive effect by the free layer 54, the coupling portion 53 and the pinned layer 52. Furthermore, in the present embodiment, the pinned layer 52 and the antiferromagnetic layer 51 are disposed away from the detection surface 5a (the medium facing surface 40). Consequently, according to the present embodiment, it is possible to reduce the read gap length, i.e., the distance between the pair of read shields 3 and 8 sandwiching the MR element 5 taken in the detection surface 5a (the medium facing surface 40), compared with a case where respective end faces of the pinned layer 52 and the antiferromagnetic layer 51 are exposed at the detection surface 5a (the medium facing surface 40).

In the present embodiment, optionally, a portion of the insulating film 61 of FIG. 1 and FIG. 2 located on the top surface of the first layer 3A may be removed to bring the first layer 3A and the second layer 3B of the first read shield 3 into contact with each other, and an insulating film may be provided instead between the coupling portion 53 and each of the second layer 3B and the nonmagnetic conductive layer 62. This makes it possible to enhance the function of the first read shield 3 by bringing the first layer 3A and the second layer 3B into contact with each other while preventing a sense current from flowing via the second layer 2B and the nonmagnetic conductive layer 62.

Second Embodiment

Figure 20:
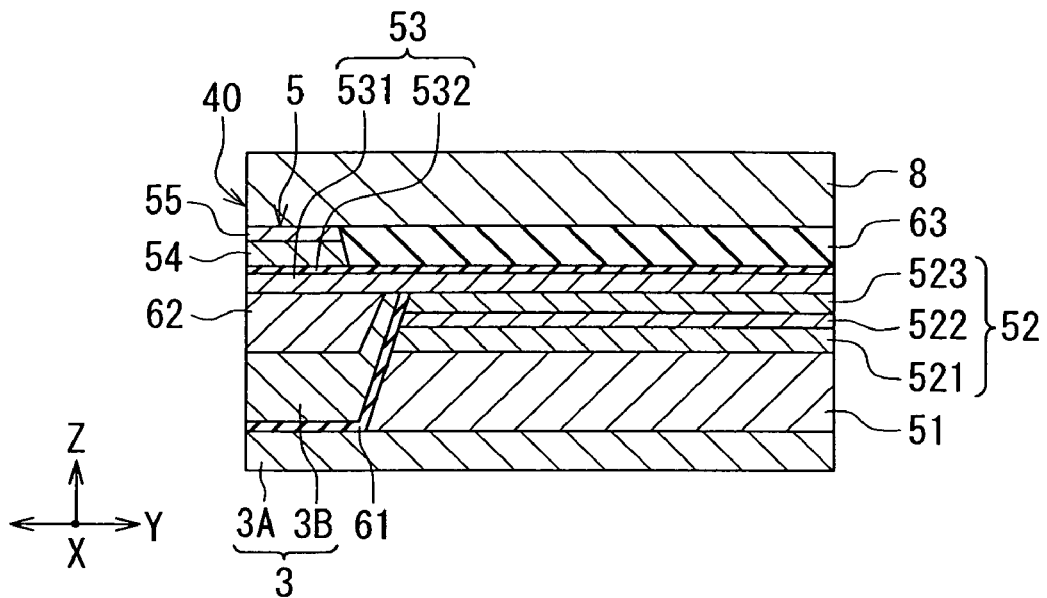
FIG. 20 is a cross-sectional view of a read head including a magnetoresistive element according to a second embodiment of the present invention.
Figure 21:
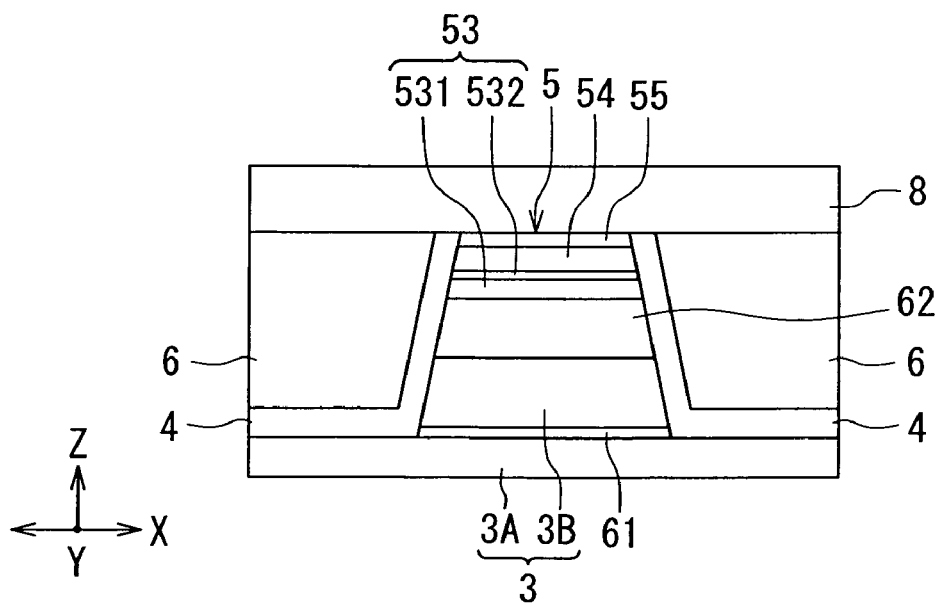
FIG. 21 is a front view of the read head of FIG. 20.

A second embodiment of the present invention will now be described with reference to FIG. 20 and FIG. 21. FIG. 20 is a cross-sectional view of a read head including an MR element according to the second embodiment. FIG. 21 is a front view of the read head shown in FIG. 20. The coupling portion 53 of the MR element 5 according to the second embodiment includes: a nonmagnetic conductive layer 531 disposed on the flattened top surfaces of the pinned layer 52, the insulating film 61, the second layer 3B and the nonmagnetic conductive layer 62; and a tunnel barrier layer 532 disposed on the nonmagnetic conductive layer 531. The configuration and function of the nonmagnetic conductive layer 531 are the same as those of the first embodiment. The tunnel barrier layer 532 is disposed between the nonmagnetic conductive layer 531 and the free layer 54. The tunnel barrier layer 532 is made of an insulating material such as alumina, $SiO_2$ or MgO.

In a method of fabricating the read head according to the second embodiment, a film that will be patterned later to thereby become the tunnel barrier layer 532 is formed in the step of FIG. 13A and FIG. 13B after the film 531P is formed.

In the MR element 5 according to the second embodiment, the nonmagnetic conductive layer 531 allows electrons to be conducted while conserving their spins. Therefore, in the present embodiment, a tunneling current passing through the tunnel barrier layer 532 varies depending on the relative angle between the magnetization direction of the pinned layer 52 and the magnetization direction of the free layer 54, according to the same principle as that for a typical TMR element. The MR element 5 of the second embodiment provides a tunneling magnetoresistive effect produced by the tunnel barrier layer 532, in addition to the magnetoresistive effect of the MR element 5 of the first embodiment. It is thus possible to obtain a greater MR ratio compared with the first embodiment. It is optional that the tunnel barrier layer 532 may be provided only below the free layer 54.

The remainder of configuration, functions and advantageous effects of the second embodiment are similar to those of the first embodiment.

Third Embodiment

Figure 22:
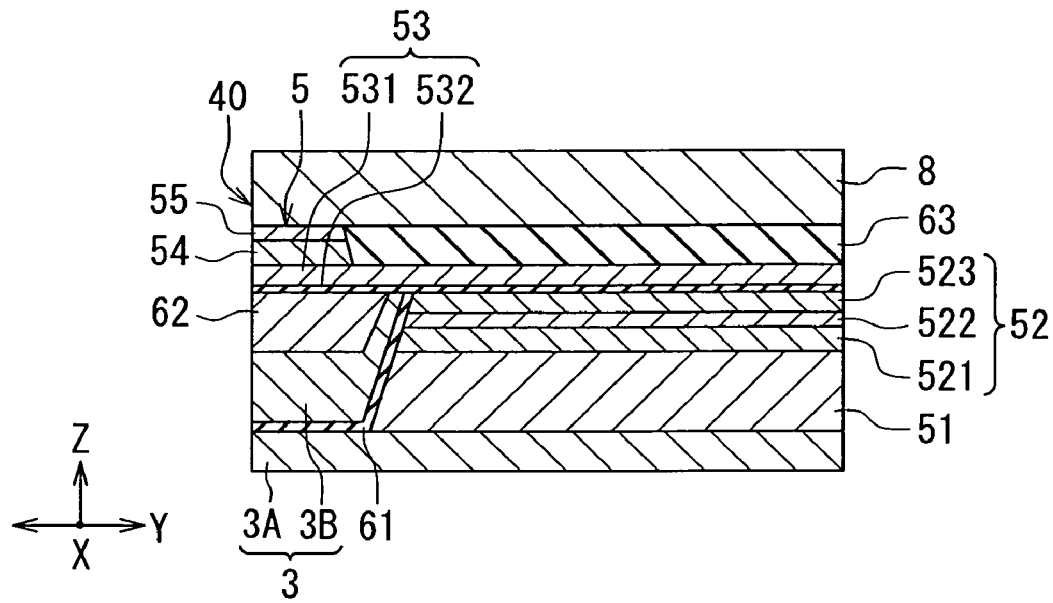
FIG. 22 is a cross-sectional view of a read head including a magnetoresistive element according to a third embodiment of the present invention.
Figure 23:
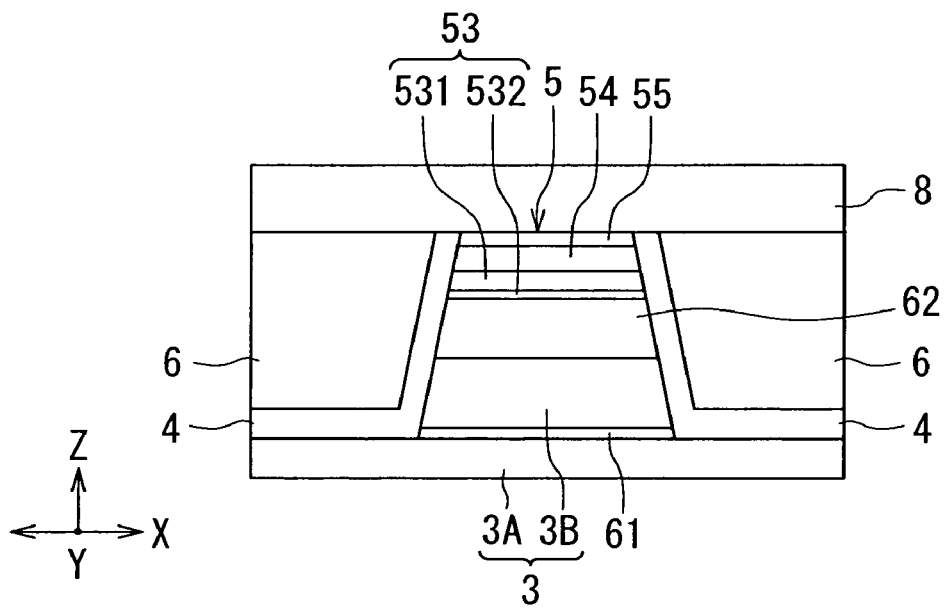
FIG. 23 is a front view of the read head of FIG. 22.

A third embodiment of the present invention will now be described with reference to FIG. 22 and FIG. 23. FIG. 22 is a cross-sectional view of a read head including an MR element according to the third embodiment. FIG. 23 is a front view of the read head shown in FIG. 22. The coupling portion 53 of the MR element 5 according to the third embodiment includes: a tunnel barrier layer 532 disposed on the flattened top surfaces of the pinned layer 52, the insulating film 61, the second layer 3B and the nonmagnetic conductive layer 62;

and a nonmagnetic conductive layer 531 disposed on the tunnel barrier layer 532. The configuration and function of the nonmagnetic conductive layer 531 are the same as those of the first embodiment. The tunnel barrier layer 532 is disposed between the nonmagnetic conductive layer 531 and the pinned layer 52. The tunnel barrier layer 532 is made of an insulating material such as alumina, $SiO_2$ or MgO.

In a method of fabricating the read head according to the third embodiment, a film that will be patterned later to thereby become the tunnel barrier layer 532 is formed in the step of FIG. 13A and FIG. 13B before the film 531P is formed.

In the MR element 5 according to the third embodiment, as in the case of the second embodiment, a tunneling current passing through the tunnel barrier layer 532 varies depending on the relative angle between the magnetization direction of the pinned layer 52 and the magnetization direction of the free layer 54. The MR element 5 of the third embodiment provides a tunneling magnetoresistive effect produced by the tunnel barrier layer 532, in addition to the magnetoresistive effect of the MR element 5 of the first embodiment. It is thus possible to obtain a greater MR ratio compared with the first embodiment.

In the third embodiment, the tunnel barrier layer 532 made of an insulating material is disposed between the nonmagnetic conductive layer 531 and each of the second layer 3B and the nonmagnetic conductive layer 62. Therefore, it is optional to bring the first layer 3A and the second layer 3B of the first read shield 3 into contact with each other by removing a portion of the insulating film 61 of FIG. 22 and FIG. 23 located on the top surface of the first layer 3A. This makes it possible to enhance the function of the first read shield 3 by bringing the first layer 3A and the second layer 3B into contact with each other while preventing a sense current from flowing via the second layer 2B and the nonmagnetic conductive layer 62. It is also optional that the tunnel barrier layer 532 may be provided only on the pinned layer 52.

The remainder of configuration, function and effects of the third embodiment are similar to those of the first embodiment.

The present invention is not limited to the foregoing embodiments but can be carried out in various modifications. For example, the free layer and the pinned layer may touch different portions of one surface of the coupling portion.

While the foregoing embodiments have been described with reference to a thin-film magnetic head having such a structure that the read head is formed on the base body and the write head is stacked on the read head, the read head and the write head may be stacked in the reverse order. If the thin-film magnetic head is to be used only for read operations, the thin-film magnetic head may be configured to include the read head only.

The present invention is applicable not only to an MR element used as the read head of a thin-film magnetic head, but also to any MR elements used for various purposes in general.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetoresistive element comprising:
a detection surface that receives a magnetic field to be detected;
a free layer made of a ferromagnetic material and having an end face located in the detection surface, the free layer exhibiting a change in magnetization direction in response to the magnetic field to be detected;
a pinned layer made of a ferromagnetic material and disposed away from the detection surface, the pinned layer having a fixed magnetization direction; and
a coupling portion made of a nonmagnetic material and coupling the free layer and the pinned layer to each other,
wherein the coupling portion includes a nonmagnetic conductive layer that allows electrons to be conducted while conserving their spins.

2. The magnetoresistive element according to claim 1, wherein:
each of the free layer and the pinned layer has a surface touching the coupling portion; and
a distance between the detection surface and an end of the surface of the pinned layer touching the coupling portion closest to the detection surface is greater than a distance between the detection surface and an end of the surface of the free layer touching the coupling portion farthest from the detection surface.

3. The magnetoresistive element according to claim 1, further comprising an antiferromagnetic layer for fixing the magnetization direction of the pinned layer, the antiferromagnetic layer being disposed away from the detection surface.

4. The magnetoresistive element according to claim 1, wherein the nonmagnetic conductive layer is formed of a carbon material having a graphene structure.

5. The magnetoresistive element according to claim 1, wherein the nonmagnetic conductive layer is formed of a graphene thin film.

6. The magnetoresistive element according to claim 1, wherein the coupling portion further includes a tunnel barrier layer disposed between the nonmagnetic conductive layer and one of the free layer and the pinned layer.

7. A thin-film magnetic head comprising:
a medium facing surface that faces toward a recording medium;
a first shield and a second shield each extending in a direction intersecting the medium facing surface; and
a magnetoresistive element disposed between the first and second shields near the medium facing surface to detect a signal magnetic field sent from the recording medium,
the magnetoresistive element comprising:
a detection surface that is located in the medium facing surface and receives the signal magnetic field sent from the recording medium;
a free layer made of a ferromagnetic material and having an end face located in the detection surface, the free layer exhibiting a change in magnetization direction in response to the signal magnetic field;
a pinned layer made of a ferromagnetic material and disposed away from the detection surface, the pinned layer having a fixed magnetization direction; and
a coupling portion made of a nonmagnetic material and coupling the free layer and the pinned layer to each other,
wherein the coupling portion includes a nonmagnetic conductive layer that allows electrons to be conducted while conserving their spins.

8. The thin-film magnetic head according to claim 7, wherein:
each of the free layer and the pinned layer has a surface touching the coupling portion; and
a distance between the detection surface and an end of the surface of the pinned layer touching the coupling portion closest to the detection surface is greater than a distance between the detection surface and an end of the surface of the free layer touching the coupling portion farthest from the detection surface.

9. The thin-film magnetic head according to claim 7, further comprising an antiferromagnetic layer for fixing the magnetization direction of the pinned layer, the antiferromagnetic layer being disposed away from the detection surface.

10. The thin-film magnetic head according to claim 7, wherein the nonmagnetic conductive layer is formed of a carbon material having a graphene structure.

11. The thin-film magnetic head according to claim 7, wherein the nonmagnetic conductive layer is formed of a graphene thin film.

12. The thin-film magnetic head according to claim 7, wherein the coupling portion further includes a tunnel barrier layer disposed between the nonmagnetic conductive layer and one of the free layer and the pinned layer.

13. A head assembly comprising: a slider disposed to face toward a recording medium; and a supporter flexibly supporting the slider, the slider including the thin-film magnetic head according to claim 7.

14. A magnetic disk drive comprising: a slider disposed to face toward a recording medium that is driven to rotate; and an alignment device supporting the slider and aligning the slider with respect to the recording medium, the slider including the thin-film magnetic head according to claim 7.

* * * * *